(12) United States Patent
Suzuki et al.

(10) Patent No.: US 10,461,053 B2
(45) Date of Patent: *Oct. 29, 2019

(54) SEMICONDUCTOR DEVICE

(71) Applicant: Renesas Electronics Corporation, Tokyo (JP)

(72) Inventors: Shinya Suzuki, Hokkaido (JP); Kiichi Makuta, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/137,683

(22) Filed: Sep. 21, 2018

(65) Prior Publication Data
US 2019/0027455 A1  Jan. 24, 2019

Related U.S. Application Data

(60) Continuation of application No. 15/587,718, filed on May 5, 2017, now abandoned, which is a continuation
(Continued)

(30) Foreign Application Priority Data

Jul. 24, 2009  (JP) .................. 2009-173356

(51) Int. Cl.
*H01L 23/52* (2006.01)
*H01L 23/00* (2006.01)
(Continued)

(52) U.S. Cl.
CPC .......... *H01L 24/17* (2013.01); *G02F 1/13306* (2013.01); *G02F 1/13452* (2013.01);
(Continued)

(58) Field of Classification Search
CPC ................. H01L 24/13; H01L 2924/00; H01L 2924/15788
See application file for complete search history.

(56) References Cited

U.S. PATENT DOCUMENTS 7,522,441 B2  4/2009  Kumagai et al.
7,750,373 B2  7/2010  Taniguchi et al.
(Continued)

FOREIGN PATENT DOCUMENTS

JP  2006-147610  6/2006

OTHER PUBLICATIONS

Official action dated May 14, 2014, issued in Chinese counterpart application (No. 201010227707.8) with English translation.
(Continued)

*Primary Examiner* — Asok K Sarkar
*Assistant Examiner* — Dmitry Yemelyanov
(74) *Attorney, Agent, or Firm* — Womble Bond Dickinson (US) LLP

(57) ABSTRACT

To provide a technique capable of reducing the chip size of a semiconductor chip and particularly, a technique capable of reducing the chip size of a semiconductor chip in the form of a rectangle that constitutes an LCD driver by devising a layout arrangement in a short-side direction. In a semiconductor chip that constitutes an LCD driver, input protection circuits are arranged in a lower layer of part of a plurality of input bump electrodes and on the other hand, in a lower layer of the other part of the input bump electrodes, the input protection circuits are not arranged but SRAMs (internal circuits) are arranged.

9 Claims, 20 Drawing Sheets

Related U.S. Application Data of application No. 15/200,246, filed on Jul. 1, 2016, now Pat. No. 9,659,926, which is a continuation of application No. 14/712,689, filed on May 14, 2015, now Pat. No. 9,391,066, which is a continuation of application No. 14/028,755, filed on Sep. 17, 2013, now abandoned, which is a division of application No. 12/793,431, filed on Jun. 3, 2010, now Pat. No. 8,564,127.

(51) Int. Cl.
| | |
|---|---|
| *G02F 1/1345* | (2006.01) |
| *H01L 27/02* | (2006.01) |
| *H01L 23/498* | (2006.01) |
| *G02F 1/133* | (2006.01) |
| *H01L 23/532* | (2006.01) |
| *H01L 23/522* | (2006.01) |
| *H01L 23/528* | (2006.01) |

(52) U.S. Cl.
CPC ...... *H01L 23/49811* (2013.01); *H01L 23/528* (2013.01); *H01L 23/5226* (2013.01); *H01L 23/53214* (2013.01); *H01L 24/10* (2013.01); *H01L 24/13* (2013.01); *H01L 24/14* (2013.01); *H01L 27/0207* (2013.01); *H01L 27/0248* (2013.01); *H01L 27/0255* (2013.01); *H01L 27/0292* (2013.01); *H01L 23/5329* (2013.01); *H01L 23/53209* (2013.01); *H01L 23/53238* (2013.01); *H01L 2224/05124* (2013.01); *H01L 2224/05166* (2013.01); *H01L 2224/05184* (2013.01); *H01L 2224/05644* (2013.01); *H01L 2224/05655* (2013.01); *H01L 2224/05664* (2013.01); *H01L 2224/05666* (2013.01); *H01L 2224/13* (2013.01); *H01L 2224/13099* (2013.01); *H01L 2224/13144* (2013.01); *H01L 2224/13644* (2013.01); *H01L 2224/1403* (2013.01); *H01L 2224/1412* (2013.01); *H01L 2224/16* (2013.01); *H01L 2224/16227* (2013.01); *H01L 2224/32225* (2013.01); *H01L 2224/73204* (2013.01); *H01L 2224/81191* (2013.01); *H01L 2224/9211* (2013.01); *H01L 2924/01002* (2013.01); *H01L 2924/0103* (2013.01); *H01L 2924/013* (2013.01); *H01L 2924/01004* (2013.01); *H01L 2924/0104* (2013.01); *H01L 2924/01005* (2013.01); *H01L 2924/01006* (2013.01); *H01L 2924/01012* (2013.01); *H01L 2924/01013* (2013.01); *H01L 2924/01015* (2013.01); *H01L 2924/01019* (2013.01); *H01L 2924/01022* (2013.01); *H01L 2924/01023* (2013.01); *H01L 2924/01025* (2013.01); *H01L 2924/01027* (2013.01); *H01L 2924/01029* (2013.01); *H01L 2924/01033* (2013.01); *H01L 2924/01041* (2013.01); *H01L 2924/01042* (2013.01); *H01L 2924/01044* (2013.01); *H01L 2924/01046* (2013.01); *H01L 2924/01047* (2013.01); *H01L 2924/01049* (2013.01); *H01L 2924/01055* (2013.01); *H01L 2924/01057* (2013.01); *H01L 2924/01059* (2013.01); *H01L 2924/01072* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/04941* (2013.01); *H01L 2924/10161* (2013.01); *H01L 2924/14* (2013.01); *H01L 2924/1426* (2013.01); *H01L 2924/15788* (2013.01); *H01L 2924/30105* (2013.01)

(56) References Cited

U.S. PATENT DOCUMENTS

| | | |
|---|---|---|
| 2005/0045955 A1 | 3/2005 | Kim et al. |
| 2006/0131726 A1 | 6/2006 | Bruch |
| 2006/0180864 A1 | 8/2006 | Suzuki et al. |
| 2006/0181823 A1 | 8/2006 | Miller et al. |
| 2007/0002061 A1 | 1/2007 | Kumagai et al. |
| 2007/0069326 A1 | 3/2007 | Yoshizumi et al. |
| 2007/0080416 A1 | 4/2007 | Yoshioka et al. |
| 2008/0149966 A1 | 6/2008 | Nakamura et al. |
| 2008/0203435 A1 | 8/2008 | Kobayashi |
| 2009/0121349 A1 | 5/2009 | Suzuki |
| 2009/0134467 A1 | 5/2009 | Ishida et al. |
| 2009/0206411 A1 | 8/2009 | Koketsu et al. |
| 2010/0117081 A1 | 5/2010 | Obuchi et al. |
| 2010/0121349 A1 | 5/2010 | Meier et al. |

OTHER PUBLICATIONS

Official action dated Oct. 15, 2013, issued in Japanese counterpart application (No. JP 2009-173356) with English translation.
Official action dated Jul. 5, 2016, issued in Japanese counterpart application (No. 2015-127219) with English translation.
Official action dated Jul. 19, 2016, issued in Korean counterpart application (No. 10-2010-0071390) with English translation.
Official action dated May 25, 2015, issued in Taiwan counterpart application (No. 099123338) with English translation.
Official action dated Nov. 30, 2016, issued in Taiwan counterpart application (No. 104144346) with English translation.
Official action dated Aug. 8, 2018, issued in Taiwan counterpart application (No. 10720719780) with English translation.

SEMICONDUCTOR DEVICE

CROSS-REFERENCE TO RELATED APPLICATION

This is a Continuation of U.S. patent application Ser. No. 15/587,718, filed May 5, 2017, abandoned, which is a Continuation of U.S. patent application Ser. No. 15/200,246, filed Jul. 1, 2016, now U.S. Pat. No. 9,659,926, which is a Continuation of U.S. patent application Ser. No. 14/712,689 filed May 14, 2015, now U.S. Pat. No. 9,391,066, which is a Continuation of U.S. patent application Ser. No. 14/028,755, filed Sep. 17, 2013, abandoned, which is a Divisional of U.S. patent application Ser. No. 12/793,431, filed Jun. 3, 2010, now U.S. Pat. No. 8,564,127, which claims priority to Japanese Patent Application No. 2009-173356 filed on Jul. 24, 2009. The contents of the aforementioned applications are incorporated by reference in their entirety.

BACKGROUND OF THE INVENTION

The present invention relates to a semiconductor device, in particular, to the technology which is effective when applied to a semiconductor device that is used as a driver for LCD (Liquid Crystal Display).

Japanese Patent Laid-Open No. 2006-210607 describes the technique capable of reducing the chip size. Specifically, buffers are arranged collectively in regions distant from pads, respectively. The regions are the main region except for the regions where the central processing unit, the non-volatile memory, and the volatile memory are formed. The buffers that require a large area are not provided in the pad peripheral part, and therefore, it is possible to reduce the interval between the pads and the distance between the pad and the internal circuit (for example, the central processing unit). Due to this, the chip size can be reduced.

Japanese Patent Laid-Open No. 2007-103848 describes the technique capable of reducing the size of a semiconductor chip. Specifically, first the pad and the wiring other than the pad are provided over the insulating film. Over the insulating film including over the pad and the wiring, the surface protection film is formed and the opening is provided in the surface protection film. The opening is formed over the pad and the surface of the pad is exposed. Over the surface protection film including the opening, the bump electrode is formed. Here, the pad is configured to have the size sufficiently smaller than that of the bump electrode. Due to this, the wiring is disposed immediately under the bump electrode and in the same layer as that of the pad. That is, the wiring is disposed in the space under the bump electrode formed by reducing the size of the pad.

SUMMARY OF THE INVENTION

In recent years, an LCD that uses liquid crystal as a display element has been spreading rapidly. The LCD is controlled by a driver that drives the LCD. The LCD driver includes a semiconductor chip, and is mounted on a glass substrate. The semiconductor chip that constitutes the LCD driver has a structure in which a plurality of transistors and multilayer wirings are formed over a semiconductor substrate and bump electrodes are formed on the surface thereof. Then, the semiconductor chip is mounted on the glass substrate via the bump electrode formed on the surface.

The semiconductor chip that constitutes an LCD driver is in the form of a rectangle having short sides and long sides and a plurality of bump electrodes is arranged along the long-side direction of the semiconductor chip. For example, along a first long side of a pair of long sides, input bump electrodes are arranged linearly and along a second long side in opposition to the first long side, output bump electrodes are arranged in a staggered manner. That is, the semiconductor chip constituting an LCD driver is characterized in that the number of output bump electrodes is greater than that of input bump electrodes. This is because the input bump electrode receives mainly serial data while the output bump electrode outputs parallel data converted by the LCD driver.

Accompanying the miniaturization of semiconductor elements, the downsizing of the semiconductor chip constituting an LCD driver is also being progressed. However, in the semiconductor chip constituting an LCD driver, the length in the long-side direction is affected largely by the number of bump electrodes. That is, in a liquid crystal display device, the number of output bump electrodes of an LCD driver is substantially determined, and therefore, the number of output bump electrodes cannot be reduced and it is becoming difficult to reduce the long side of the semiconductor chip constituting the LCD driver. That is, it is necessary to form a predetermined number of output bump electrodes along the long side of the semiconductor chip constituting the LCD driver, however, the distance between the bump electrodes has been reduced to a minimum, and therefore, it is difficult to further reduce the length in the long-side direction of the semiconductor chip.

An object of the present invention is to reduce the chip size of a semiconductor chip.

The above-mentioned and the other purposes and the new feature of the present invention will become clear from the description of the present specification and the accompanying drawings.

The following explains briefly the outline of a typical invention among the inventions disclosed in the present application.

A semiconductor device according to a typical embodiment comprises a semiconductor chip in the form of a rectangle having a pair of short sides and a pair of long sides. Here, the semiconductor chip includes (a) a plurality of first bump electrodes arranged along a first long side of the semiconductor chip and arranged at a position closer to the first long side than to a second long side in opposition to the first long side, (b) an internal circuit formed in the semiconductor chip, and (c) a plurality of first electrostatic protection circuits which protect the internal circuit against static electricity and are electrically coupled to the first bump electrodes. At this time, part of the first electrostatic protection circuits electrically coupled to part of the first bump electrodes are arranged at a position that overlaps the part of the first bump electrodes in a planar view, and the other first electrostatic protection circuits of the first electrostatic protection circuits electrically coupled to the other first bump electrodes of the first bump electrodes are arranged at a position different from a position that overlaps the other first bump electrodes in a planar view.

A semiconductor device according to a typical embodiment comprises a semiconductor chip in the form of a rectangle having a pair of short sides and a pair of long sides. Here, the semiconductor chip includes (a) a plurality of first bump electrodes arranged along a first long side of the semiconductor chip and arranged at a position closer to the first long side than to a second long side in opposition to the first long side, (b) an internal circuit formed in the semiconductor chip, and (c) a plurality of first electrostatic protection circuits which protect the internal circuit against static electricity and are electrically coupled to the first bump electrodes. At this time, the first electrostatic protection circuits are arranged at a position different from a position that overlaps the first bump electrodes in a planar view.

A semiconductor device according to a typical embodiment comprises a semiconductor chip in the form of a rectangle having a first short side, a second short side in opposition to the first short side, a first long side, and a second long side in opposition to the first long side. Here, the semiconductor chip includes (a) first bump electrodes and second bump electrodes arranged along the first long side of the semiconductor chip and arranged at a position closer to the first long side than to the second long side and (b) an uppermost layer wiring arranged via an insulating film at a position that overlaps the first bump electrode and the second bump electrode in a planar view. Further, the semiconductor chip includes (c) a first opening formed in the insulating film in order to be coupled to the first bump electrode and (d) a second opening formed in the insulating film in order to be coupled to the second bump electrode. At this time, the position where the first opening is formed relative to the first bump electrode is different from the position where the second opening is formed relative to the second bump electrode in the direction along the first short side or the second short side.

A semiconductor device according to a typical embodiment comprises a semiconductor chip in the form of a rectangle having a pair of short sides and a pair of long sides. Here, the semiconductor chip includes (a) first bump electrodes and second bump electrodes arranged along a first long side of the semiconductor chip and arranged at a position closer to the first long side than to a second long side in opposition to the first long side and (b) an uppermost layer wiring arranged via an insulating film at a position that overlaps the first bump electrode and the second bump electrode in a planar view. The semiconductor chip further has (c) a first opening formed in the insulating film in order to be coupled to the first bump electrode and (d) a second opening formed in the insulating film in order to be coupled to the first bump electrode. At this time, the uppermost layer wiring includes a first uppermost layer wiring that is coupled to the first bump electrode via the first opening and a second uppermost layer wiring which is coupled to the first bump electrode via the second opening and is different from the first uppermost layer wiring, and the first opening and the second opening are formed so as to be coupled to the first bump electrode at different positions.

A semiconductor device according to a typical embodiment comprises a semiconductor chip in the form of a rectangle having a first short side, a second short side in opposition to the first short side, a first long side, and a second long side in opposition to the first long side. Here, the semiconductor chip includes (a) first bump electrodes arranged along the first long side of the semiconductor chip and arranged at a position closer to the first long side than to the second long side in opposition to the first long side, (b) an internal circuit formed in the semiconductor chip, and (c) a first electrostatic protection circuit which protects the internal circuit against static electricity and is electrically coupled to the first bump electrode. At this time, the internal circuit is disposed at a position that overlaps the first bump electrode in a planar view and the first electrostatic protection circuit is arranged at a position different from a position that overlaps the first bump electrode in a planar view.

A semiconductor device according to a typical embodiment comprises a semiconductor chip in the form of a rectangle having a first short side, a second short side in opposition to the first short side, a first long side, and a second long side in opposition to the first long side. Here, the semiconductor chip includes (a) first bump electrodes arranged along the first long side of the semiconductor chip and arranged at a position closer to the first long side than to the second long side in opposition to the first long side, (b) an internal circuit formed in the semiconductor chip, and (c) a first electrostatic protection circuit which protects the internal circuit against static electricity and is electrically coupled to the first bump electrode. At this time, the first electrostatic protection circuit is disposed at a position different from a position that overlaps the first bump electrode in a planar view and a plurality of wirings passes at the position that overlaps the first bump electrode in a planar view.

The following explains briefly the effect acquired by the typical invention among the inventions disclosed in the present application.

It is possible to reduce the chip size of a semiconductor chip.

DETAILED DESCRIPTION OF THE PREFERRED EMBODIMENTS

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc.

Similarly, it is assumed that, in the following embodiments, when the shapes, positional relationships, etc., of the components etc. are referred to, except when explicitly stated in particular or when they can apparently be thought otherwise in principle, those substantially similar to or resembling the shapes etc. are also included. This also applies to the above-mentioned numerical values and ranges.

In all of the drawings for explaining embodiments, the same symbol is attached to the same member, as a principle, and the repeated explanation thereof is omitted. In order to make a drawing intelligible, hatching may be attached even if it is a plane view.

First Embodiment

For an LCD driver, the downsizing of a semiconductor chip is progressed as described above, and in particular, the reduction of a semiconductor chip in the short-side direction has been examined.

Figure 1:
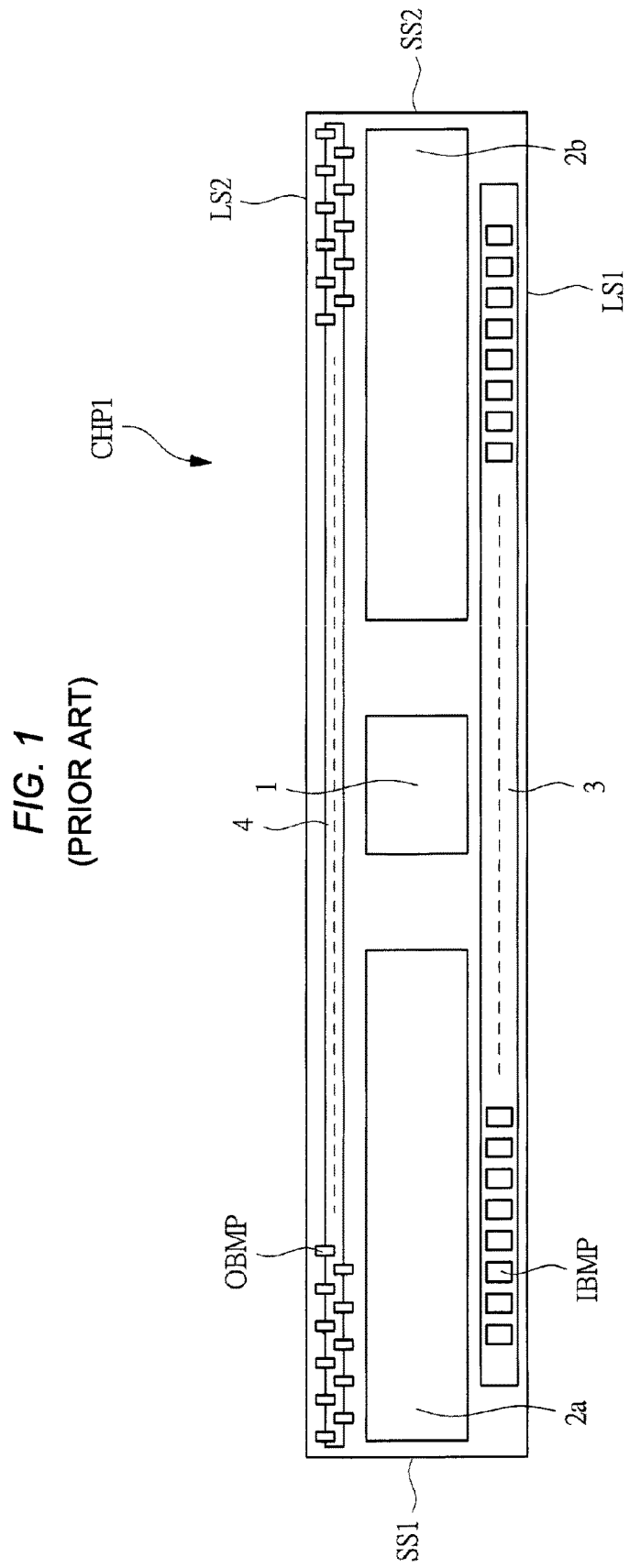
FIG. 1 is a diagram showing a configuration of a semiconductor chip constituting a general LCD driver.

First, an external configuration of a general LCD driver will be described. FIG. 1 is a plan view showing the surface of a semiconductor chip CHP1 constituting an LCD driver. In FIG. 1, the semiconductor chip CHP1 has a semiconductor substrate formed into the form of, for example, an elongated rectangle (form of a rectangle), and over the main surface thereof, an LCD driver that drives a display device, such as a liquid crystal display device, is formed.

The semiconductor chip CHP1 is in the form of a rectangle having a pair of short sides (short side SS1 and short side SS2) and a pair of long sides (long side LS1 and long side LS2) and along one of the pair of long sides, that is, the long side LS1 (side on the lower side in FIG. 1), a plurality of input bump electrodes IBMP is arranged. These input bump electrodes IBMP are arranged linearly. The input bump electrode IBMP functions as an external connection terminal to be coupled to an integrated circuit (LSI (Large Scale Integration)) including semiconductor elements and wirings formed inside the semiconductor chip CHP1. In particular, the input bump electrode IBMP is a bump electrode for a digital input signal or analog input signal.

Next, along the other of the pair of long sides, that is, the long side LS2 (side on the upper side in FIG. 1), a plurality of output bump electrodes OBMP is arranged. These output bump electrodes OBMP are arranged in two rows along the long side LS2 and the output bump electrodes OBMP in the two rows along the long side LS2 are arranged in a staggered manner. Due to this, it is possible to arrange the output bump electrodes OBMP highly densely. The output bump electrode OBMP also functions as an external connection terminal to couple the integrated circuit formed inside the semiconductor substrate to outside. In particular, the output bump electrode OBMP is a bump electrode for an output signal from the integrated circuit.

As described above, along the pair of the long side LS1 and the long side LS2 constituting the outer circumference of the semiconductor chip CHP1, the input bump electrodes IBMP and the output bump electrodes OBMP are formed as a result. At this time, the number of the output bump electrodes OBMP is greater compared to the number of the input bump electrodes IBMP, and therefore, while the input bump electrodes IBMP are formed linearly along the long side LS1, the output bump electrodes OBMP are arranged along the long side LS2 in a staggered manner. This is because while the input bump electrode IBMP is a bump electrode for an input signal to be input to an LDC driver, the output bump electrode OBMP is a bump electrode for an output signal to be output from an LCD driver. That is, an input signal to be input to an LCD driver is serial data, and therefore, the number of the input bump electrodes IBMP, an external connection terminal, is not so great. In contrast to this, an output signal to be output from an LCD driver is parallel data, and therefore, the number of the output bump electrodes OBMP, an external connection terminal, is great. That is, the output bump electrode OBMP is provided corresponding to each individual cell (pixel) constituting a liquid crystal display element, and therefore, the number of the output bump electrodes OBMP needs to be that corresponding to the number of rows and columns (for example, gate line, source line) for driving cells. Because of this, the number of the output bump electrodes OBMP is greater than that of the input bump electrodes IBMP. As a result of the above, it is possible to arrange the input bump electrodes IBMP along the long side LS1 linearly, however, the output bump electrodes OBMP are arranged along the long side LS2 in a staggered manner so that the number of the output bump electrodes OBMP that can be arranged is increased.

In FIG. 1, the input bump electrodes IBMP and the output bump electrodes OBMP are arranged, respectively, along the pair of the long side LS1 and the long side LS2 constituting the semiconductor chip CHP1, however, it is also possible to further arrange them along the pair of the short side SS1 and the short side SS2, in addition to the pair of the long side LS1 and the long side LS2.

The external configuration of the semiconductor chip CHP1 is as described above, and the function of an LCD driver that is realized by an integrated circuit formed in the semiconductor chip CHP1 will be described below. FIG. 1 also shows a functional block showing the function of an LCD driver. In FIG. 1, the semiconductor chip CHP1 has a control part 1, an SRAM (Static Random Access Memory) 2a and an SRAM 2b, which are a memory circuit, an input protection circuit (electrostatic protection circuit) 3, and an output protection circuit (electrostatic protection circuit) 4. The control part 1 is configured so as to include, for example, an LCD control part and an analog part, and the SRAM 2a and SRAM 2b include, for example, a memory cell array in which memory cells (storage element) of SRAM are arranged in a matrix, an SRAM control part that drives the memory cell array, and a word driver. Further, the input protection circuit 3 and the output protection circuit 4 are configured, for example, as a part of an input circuit, an output circuit, or an I/O circuit, which is an input/output circuit.

The I/O circuit has a function to input/output data to be input to and output from the semiconductor chip CHP1, and the SRAMs 2a, 2b are an example of a storage circuit (memory circuit) that stores data. The SRAMs 2a, 2b have a structure in which storage elements that store data are arranged in an array and store data of images etc. to be displayed in a liquid crystal display device. The word driver has a function to select a row of the SRAMs 2a, 2b arranged in an array (matrix) and the SRAM control part has a function to control the writing of data to and reading data from the SRAMs 2a, 2b. That is, the SRAM control part includes an address decoder and a read/write control circuit to control the reading and writing of the SRAMs 2a, 2b.

The LCD control part has a function to generate access signals for a microcomputer to be mounted outside the LCD driver (semiconductor chip CHP1), timing signals to operate the SRAMs 2a, 2b and an internal circuit required to produce a display of a counter, etc., and comprises a reset circuit to reset a display, a clock circuit to generate a clock signal, etc. Further, the analog part has a function (level shift function) to, for example, increase the voltage level of image data stored in the SRAMs 2a, 2b and convert the voltage into a voltage suitable to a liquid crystal display cell etc. That is, the analog circuit is configured so as to include a step-up circuit to increase a voltage and so as to generate various voltages to be applied to a liquid crystal display cell.

The input protection circuit 3 is a circuit having a function to protect internal circuits (SRAM, word driver, SRAM control part, LCD control part, analog part, etc.) against a surge voltage applied accidentally to the input bump electrode IBMP. Here, a surge voltage refers to an abnormal voltage induced instantaneously by static electricity etc. Similarly, the output protection circuit 4 is a circuit that protects the internal circuit against a surge voltage applied accidentally to the output bump electrode OBMP. By providing the input protection circuit 3 and the output protection circuit 4 as described above, it is possible to protect the internal circuit that realizes the function of the LCD driver against static electricity etc.

Figure 2:
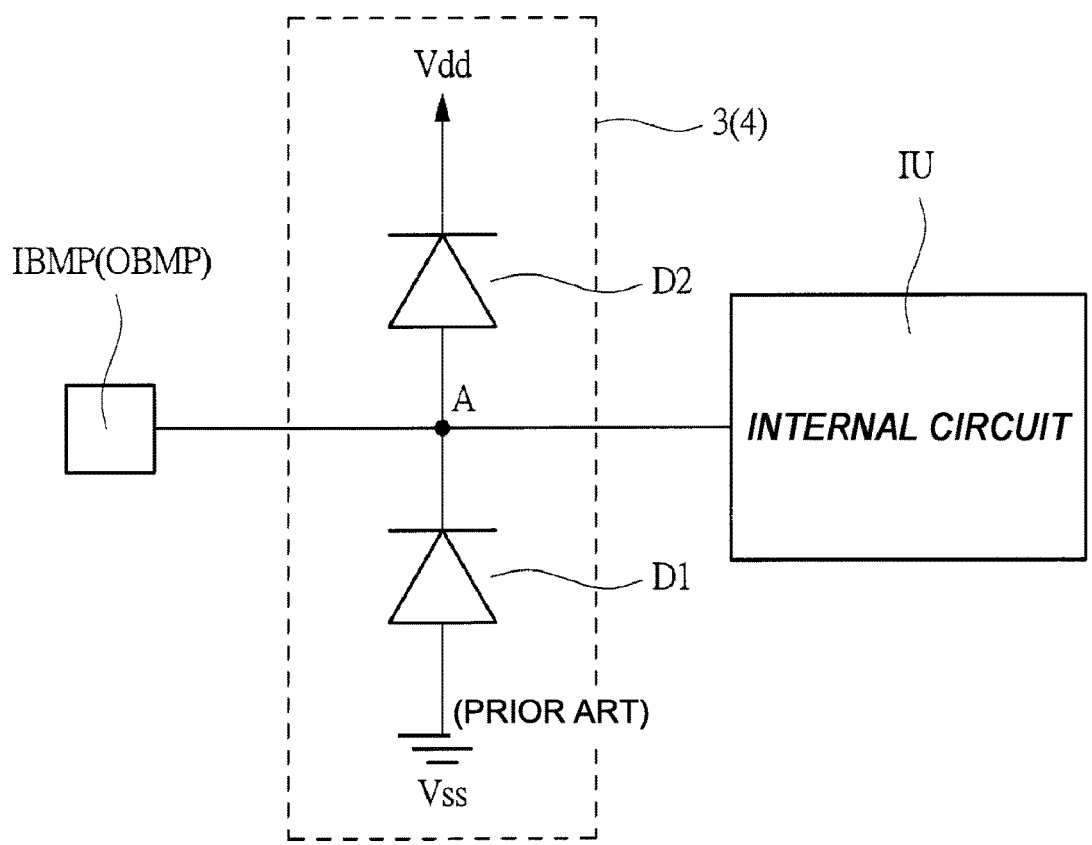
FIG. 2 is a circuit block diagram showing an example of an input protection circuit.

A configuration example of the input protection circuit 3 and the output protection circuit 4 will be described below. FIG. 2 is a diagram showing a configuration example of the input protection circuit 3 provided between the input bump electrode IBMP and an internal circuit IU. In FIG. 2, the input protection circuit 3 is coupled between the input bump electrode IBMP and the internal circuit IU. That is, the input bump electrode IBMP and the internal circuit IU are electrically coupled via the input protection circuit 3. The internal circuit IU refers to, for example, a circuit that includes the control part 1, the SRAMs 2a, 2b, etc. As shown in FIG. 2, the input protection circuit 3 has a diode D1 and a diode D2. The anode of the diode D1 is coupled to a ground potential Vss and the cathode of the diode D1 is coupled to a point A to couple the input bump electrode IBMP and the internal circuit IU. On the other hand, the anode of the diode D2 is coupled to the point A and the cathode of the diode D2 is coupled to a power source potential Vdd. The input protection circuit 3 is configured as described above and its operation will be described below.

First, the normal operation will be described. When an input voltage is applied to the input bump electrode IBMP, the potential at the terminal A becomes a predetermined potential. At this time, the potential at the terminal A is higher than the ground potential Vss and lower than the power source potential Vdd. Because of this, when the diode D1 is considered, the cathode of the diode D1 (potential at the terminal A) is higher in potential than the anode of the diode D1 (ground potential Vss), and therefore, no current flows through the diode D1. Similarly, when the diode D2 is considered, the cathode of the diode D2 (power source potential Vdd) is higher in potential than the anode of the diode D2 (potential at the terminal A), and therefore, no current flows through the diode D2. As described above, in the normal operation, no current flows through the diode D1 or the diode D2, and therefore, an input voltage (input signal) input to the input bump electrode IBMP is output to the internal circuit IU.

Subsequently, an abnormal operation will be described. For example, a case is considered, where a surge voltage is applied to the input bump electrode IBMP due to the influence of static electricity etc. Specifically, when a positive voltage greater than the power source potential Vdd is applied as a surge voltage, a positive voltage greater than the power source potential Vdd is applied to the terminal A to which the cathode of the diode D1 is coupled. Because of this, to the diode D1, a great backward voltage is applied, causing breakdown, and a backward current flows from the terminal A toward the ground potential Vss. On the other hand, a positive voltage greater than the power source potential Vdd is applied to the anode of the diode D2, and therefore, a forward current flows through the diode D2 from the terminal A toward the power source potential Vdd. As described above, when a positive voltage greater than the power source potential Vdd is applied as a surge voltage, the diode D1 breaks down in the backward direction and the diode D2 turns on in the forward direction, and therefore, it is possible to let charges accompanying the surge voltage escape to the power source line or the ground line. As a result of that, it is possible to prevent the internal circuit IU from being destroyed by the application of a high voltage.

Similarly, when a negative voltage of absolute value greater than the ground potential Vss is applied as a surge voltage, a negative potential smaller than the ground potential Vss is applied to the terminal A to which the cathode of the diode D1 is coupled. Because of this, a forward voltage is applied to the diode D1 and a forward current flows from the ground potential Vss toward the terminal A. On the other hand, a great negative potential is applied to the anode of the diode D2, and therefore, a great backward voltage is applied to the diode D2, the diode D2 breaks down, and a backward current flows from the power source potential Vdd toward the terminal A. As described above, when a great negative voltage is applied as a surge voltage, the diode D2 breaks down in the backward direction and the diode D1 turns on in the forward direction, and therefore it is possible to let charges accompanying the surge voltage escape to the power source line and the ground line. As a result of that, it is possible to prevent the internal circuit IU from being destroyed by the application of a high voltage.

Figure 3:
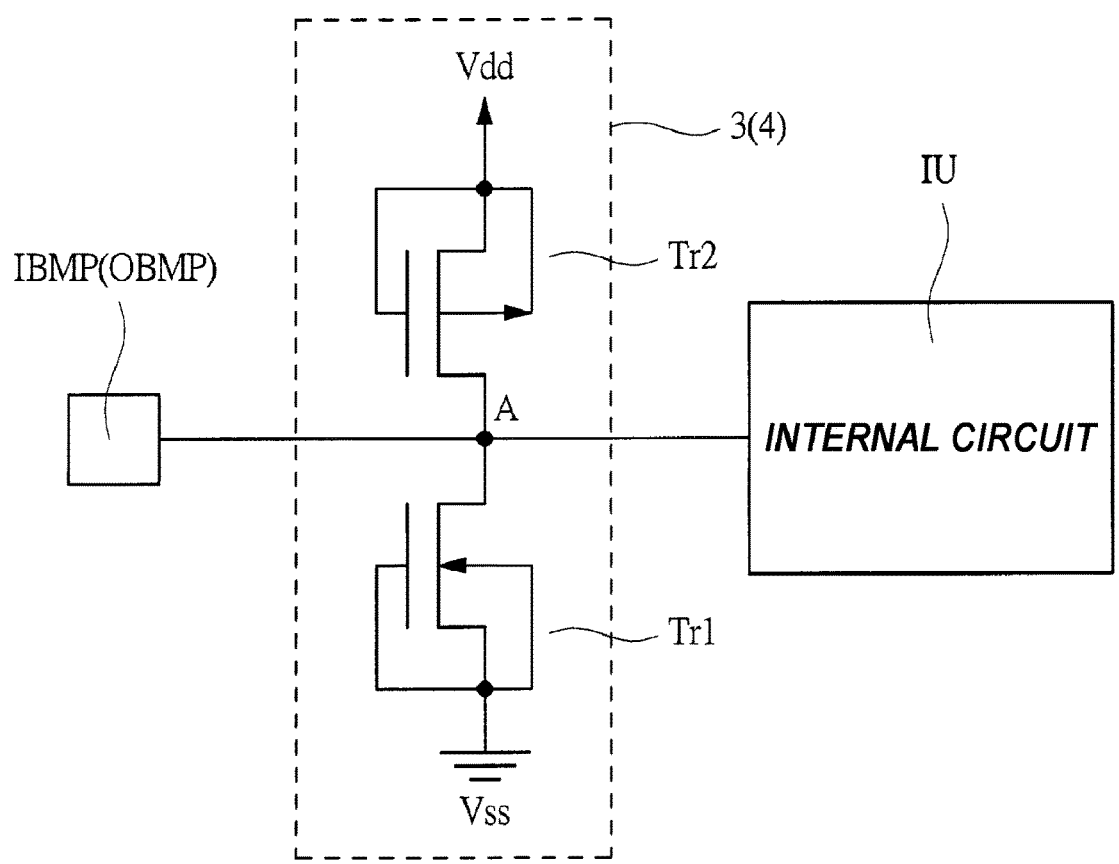
FIG. 3 is a circuit block diagram showing another example of an input protection circuit.

Further, FIG. 3 is a diagram showing another configuration example of the input protection circuit 3 provided between the input bump electrode IBMP and the internal circuit IU. In FIG. 3, the input protection circuit 3 is coupled between the input bump electrode IBMP and the internal circuit IU. That is, the input bump electrode IBMP and the internal circuit IU are electrically coupled via the input protection circuit 3 as a result. The internal circuit IU refers to, for example, a circuit that includes the control part 1, the SRAMs 2a, 2b, etc. As shown in FIG. 3, the input protection circuit 3 has an n-channel type MISFET Tr1 and a p-channel type MISFET Tr2. In the n-channel type MISFET Tr1, a drain region is coupled to the terminal A and a source region and a gate electrode are coupled to the ground potential Vss. On the other hand, in the p-channel type MISFET Tr2, the drain region is coupled to the terminal A and the source region and the gate electrode are coupled to the power source potential Vdd.

In the input protection circuit 3 also, which has the above-described configuration, when a surge voltage is applied to the terminal A from outside, one of the n-channel type MISFET Tr1 and the p-channel type MISFET Tr2 turns on in accordance with the polarity of the surge voltage and the other breaks down between the source region and the drain region. Due to this, it is possible to let charges accompanying the surge voltage escape to the power source line and the ground line. As a result of that, it is possible to prevent the internal circuit IU from being destroyed by the application of a high voltage. As described above, the configuration example of the input protection circuit 3 is described, and the output protection circuit 4 has a configuration similar to that of the input protection circuit 3.

The main functions of the LCD driver are realized in the functional blocks described above, and these functional blocks are arranged so as to stand side by side in the long-side direction of the semiconductor chip CHP1 in the form of a rectangle as shown in FIG. 1, for example. Each functional block constituting the LCD driver includes MISFET formed over the semiconductor substrate and multi-layer wirings formed over the MISFET, respectively. At this time, for example, the SRAM control part and the LCD control part are formed by a digital circuit and the analog part is formed by an analog circuit. The SRAM control part and the LCD control part are formed by a digital circuit, however, the MISFET constituting the digital circuit includes a low withstand voltage MISFET having an operating voltage of small absolute value. That is, the SRAM control part and the LCD control part include a logic circuit and thereby the degree of integration is increased. Because of this, the finer the MISFET becomes, the lower the absolute value of the operating voltage of the MISFET becomes. Because of this, the SRAM control part and the LCD control part use a low withstand voltage MISFET having an operating voltage of the smallest absolute value among the LCD drivers. For example, the absolute value of the operating voltage of the low withstand voltage MISFET used in the LCD control part is about 1.5 V.

On the other hand, the analog part includes an analog circuit and the MISFET constituting the analog circuit includes a high withstand voltage MISFET having an operating voltage of the absolute value comparatively higher than that of the low withstand voltage MISFET. This is because the analog circuit has a function to convert the voltage level of image data and apply a voltage of a medium or high voltage (a few tens of V) to the liquid crystal display cell. As described above, in the semiconductor chip CHP1 constituting the LCD driver, a plurality of kinds of MISFET having an operating voltage of different absolute values is formed and in particular, in the SRAM control part and the LCD control part, a low withstand voltage MISFET having an operating voltage of the smallest absolute value is used. In contrast to this, in the analog part, a high withstand voltage MISFET having an operating voltage of the comparatively high absolute value is used. Further, as the MISFET used in the input protection circuit 3 or the output protection circuit 4 described above, a high withstand voltage MISFET is used. The absolute value of operating voltage of these high withstand voltage MISFETs is, for example, about 20 to 30 V.

Next, the operation of the LCD driver will be described briefly. First, serial data to display an image is input from a microcomputer etc. mounted outside the LCD driver (semiconductor chip CHP1). The serial data is input to the LCD control part via an I/O circuit. The LCD control part having received the serial data converts the serial data into parallel data based on a clock signal generated in a clock circuit. Then, the LCD control part outputs a control signal to the SRAM control part to store the converted parallel data in the SRAMs 2a, 2b. The SRAM control part, when receiving the control signal from the LCD control part, activates the word driver and causes the SRAMs 2a, 2b to store image data, which is parallel data. Then, the SRAM control part reads the image data stored in the SRAMs 2a, 2b at a predetermined timing and outputs it to the analog part. The analog part converts the voltage level of the image data (parallel data) and outputs the image data from the LCD driver. The image data (parallel data) output from the LCD driver is applied to each individual liquid crystal display cell and thus an image is displayed. Thus, it is possible for the LCD driver to display an image in the liquid crystal display device.

In the semiconductor chip CHP1 constituting a general LCD driver shown in FIG. 1, the input bump electrodes IBMP are formed along the long side LS1 and the output bump electrodes OBMP are formed along the long side LS2. Here, the output bump electrodes OBMP are provided so that the number of the output bump electrodes OBMP arranged along the long side LS2 corresponds to the number of row and column lines (for example, gate line, source line) that drive cells, and the number is greater than the number of the input bump electrodes IBMP arranged along the long side LS1. Because of this, the length in the long-side direction of the semiconductor chip CHP1 constituting the LCD driver is substantially regulated by the number of the output bump electrode OBMP, which is greater than that of the input bump electrodes IBMP. Because of this, when the number of the output bump electrodes OBMP is regulated, it becomes difficult to reduce the length in the long-side direction of the semiconductor chip CHP1 constituting the LCD driver. Further, when the arrangement of the output bump electrodes OBMP arranged in the long-side direction of the LCD driver is changed to another, it is required to change the layout of the wirings that couple the display part of the liquid crystal display device that mounts the LCD driver and the LCD driver. Normally, the LCD driver is delivered to a maker that manufactures the display part of the liquid crystal display device and then the LCD driver is mounted in the liquid crystal display device. At this time, the maker that manufactures the liquid crystal display device does not desire to change the configuration of the display part, and therefore, the arrangement of the output bump electrodes OBMP to be arranged in the long-side direction of the LCD driver is regulated in advance. Because of this, it becomes difficult to change the arrangement and the number of the output bump electrodes OBMP to be formed in the LCD driver. This also forms a factor to make it difficult to reduce the long side of the semiconductor chip CHP1 constituting the LCD driver. Despite the above, accompanying the miniaturization of a semiconductor element, the reduction in chip size of the semiconductor chip CHP1 constituting the LCD driver has been desired. Because of this, it has been examined to reduce the size in the short-side direction of the semiconductor chip CHP1 in an attempt to reduce in size the semiconductor chip CHP1 constituting the LCD driver. Hereinafter, a technical idea will be described which can reduce the length in the short-side direction of the semiconductor chip CHP1 constituting the LCD driver by devising the layout configuration of the semiconductor chip CHP1.

Figure 4:
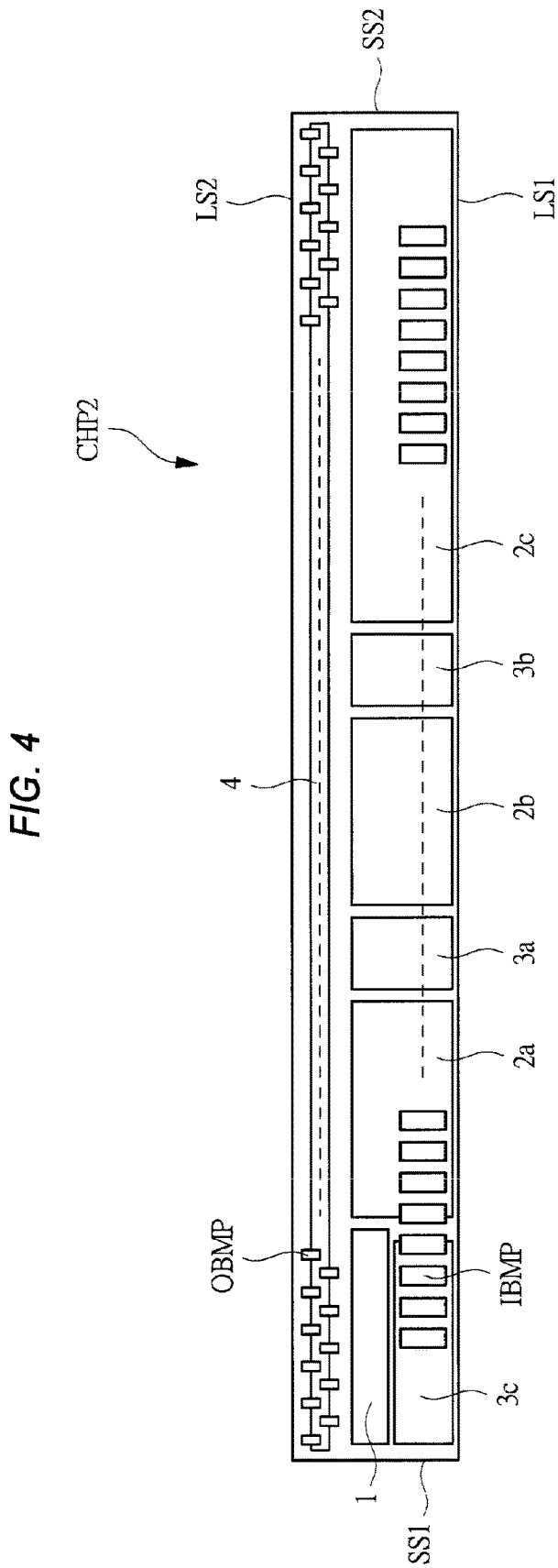
FIG. 4 is a diagram showing a configuration of a semiconductor chip constituting an LCD driver in a first embodiment of the present invention.

FIG. 4 is a diagram showing a layout configuration of a semiconductor chip CHP2 in the present first embodiment. In FIG. 4, the semiconductor chip CHP2 in the present first embodiment is in the form of a rectangle having a pair of the short side SS1 and the short side SS2 and a pair of the long side LS1 and the long side LS2 as in the general semiconductor chip CHP1 shown in FIG. 1. Then, the input bump electrodes IBMP are arranged along the long side LS1 at a position closer to the long side LS1 than to the long side LS2 in opposition to the long side LS1. On the other hand, the output bump electrodes OBMP are arranged along the long side LS2 at a position closer to the long side LS2 than to the long side LS1 in opposition to the long side LS2. Further, the semiconductor chip CHP2 in the present first embodiment has the control part 1, the SRAMs 2a, 2b, and an SRAM 2c, input protection circuits 3a to 3c, and the output protection circuit 4 as in the general semiconductor chip CHP1 shown in FIG. 1. The input protection circuits 3a to 3c are configured so as to protect the internal circuit from static electricity and to be electrically coupled to the input bump electrodes IBMP, and the output protection circuit 4 is also configured so as to protect the internal circuit from static electricity and to be electrically coupled to the output bump electrodes OBMP.

Here, points of difference between the semiconductor chip CHP2 in the present first embodiment shown in FIG. 4 and the general semiconductor chip CHP1 shown in FIG. 1 will be described. First, in the general semiconductor chip CHP1 shown in FIG. 1, the output bump electrodes OBMP are formed along the long side LS2 and in the lower layer that overlaps the output bump electrode OBMP in a planar view, the output protection circuit 4 is formed. That is, the output protection circuit 4 is arranged along the long side LS2 similarly to the output bump electrode OBMP. Then, at the center part of the semiconductor chip CHP1 adjacent to the output protection circuit 4, the SRAMs 2a, 2b and the control part 1 are formed. Specifically, the SRAMs 2a, 2b and the control part 1 are arranged so as to stand side by side in the long-side direction. Subsequently, the input bump electrodes IBMP are formed along the long side LS1 in opposition to the long side LS2 of the semiconductor chip CHP1 and in the lower layer that overlaps the input bump electrode IBMP in a planar view, the input protection circuit 3 is formed. Because of this, the functional blocks that function as the LCD driver include the output protection circuit 4 formed along the long side LS2, the input protection circuit 3 formed along the long side LS1, and the SRAMs 2a, 2b and the control part 1 formed at the center part between the output protection circuit 4 and the input protection circuit 3. In other words, in the semiconductor chip CHP1, if a region along the long side LS2 is defined as an upper tier block, a region along the long side LS1 as a lower tier block, and a region sandwiched by the upper tier block and the lower tier block as a center block, in the general semiconductor chip CHP1, in the upper tier block, the output protection circuit 4 is formed and in the center block, the SRAMs 2a, 2b and the control part 1 are formed. Then, in the lower tier block, the input protection circuit 3 is formed. Because of this, in the general LCD driver, the length in the short-side direction is regulated by the output protection circuit 4 formed in the upper tier block, the SRAMs 2a, 2b and the control part 1 formed in the center block, and the input protection circuit 3 formed in the lower tier block as a result.

In contrast to this, in the semiconductor chip CHP2 in the present first embodiment shown in FIG. 4, along the long side LS2, the output bump electrodes OBMP are formed, and in the lower layer that overlaps the output bump electrode OBMP in a planar view, the output protection circuit 4 is formed. That is, similarly to the output bump electrode OBMP, the output protection circuit 4 is arranged along the long side LS2. Then, at the center part of the semiconductor chip CHP2 adjacent to the output protection circuit 4, the SRAMs 2a to 2c, the control part 1, and the input protection circuits 3a to 3c are formed. That is, in the semiconductor chip CHP2 in the present first embodiment, in the upper tier block along the long side LS2, the output protection circuit 4 is formed and in the center block adjacent to the upper tier block, the SRAMs 2a to 2c, the control part 1, and the input protection circuits 3a to 3c are formed. That is, in the semiconductor chip CHP1 constituting the general LCD driver shown in FIG. 1, the output protection circuit 4, the SRAMs 2a, 2b, the control part 1, and the input protection circuit 3 are arranged separately in the three tiers, that is, the upper tier block, the center block, and the lower tier block, however, in the semiconductor chip CHP2 constituting the LCD driver in the present first embodiment, the region is included, in which the output protection circuit 4, the SRAMs 2a to 2c, the control part 1, and the input protection circuits 3a to 3c are arranged separately in the two tiers, that is, the upper tier block and the center block, and this is the point of difference. Here, if the region where the control part 1 and the input protection circuit 3c are arranged is focused on, it seems that the output protection circuit 4, the control part 1, and the input protection circuit 3c are arranged in three tiers, however, if it is assumed that the length in the short-side direction of the SRAMs 2a to 2c is regarded as the length in the short-side direction of the center block, the total length in the short-side direction of the control part 1 and the input protection circuit 3c is shorter than the length in the short-side direction of the SRAMs 2a to 2c, and therefore, it can be thought that the control part 1 and the input protection circuit 3c are formed substantially in the range of the center block regulated by the length in the short-side direction of the SRAMs 2a to 2c. Because of this, in the present first embodiment, the layout configuration shown in FIG. 4 is also expressed as that the output protection circuit 4, the SRAMs 2a to 2c, the control part 1, and the input protection circuits 3a to 3c are arranged separately in the two tiers, that is, the upper tier block and the center block. Alternatively, by taking into consideration the region where the control part 1 and the input protection circuit 3c are arranged, which can be regarded as a region including three separate tiers, it is possible to express the configuration in the present first embodiment as that the output protection circuit 4, the SRAMs 2a to 2c, the control part 1, and part of the input protection circuits 3a to 3c are arranged separately in the two tiers, that is, the upper tier block and the center block.

As described above, the semiconductor chip CHP2 constituting the LCD driver in the present first embodiment is characterized in that the output protection circuit 4, the SRAMs 2a to 2c, the control part 1, and the input protection circuits 3a to 3c are arranged separately in the two tiers, that is, the upper tier block and the center block, rather than arranged in the three tiers, that is, the upper tier block, the center block, and the lower tier block. In other words, the present first embodiment is characterized in that the input protection circuits 3a to 3c are arranged in part of the center block where the SRAMs 2a to 2c and the control part 1 are arranged instead of that the input protection circuits 3a to 3c are arranged in the lower tier block so that they are arranged along the long side LS1. Due to this, according to the semiconductor chip CHP2 in the present first embodiment, it is possible to reduce the length in the short-side direction. That is, in the semiconductor chip CHP1 constituting the general LCD driver shown in FIG. 1, the upper tier block, the center block, and the lower tier block are arranged along the short-side direction and the length in the short-side direction is determined by the area occupied by the three tiers, that is, the upper tier block, the center block, and the lower tier block. In contrast to this, according to the semiconductor chip CHP2 in the present first embodiment shown in FIG. 4, along the short-side direction, the upper tier block and the center block are arranged and the length in the short-side direction is determined by the area occupied by the two tiers, that is, the upper tier block and the center block. That is, in the semiconductor chip CHP2 shown in FIG. 4, the lower tier block that exists in the semiconductor chip CHP1 shown in FIG. 1 does not exist. Because of this, it is possible to reduce the length in the short-side direction by an amount that would be occupied by the lower tier block that is no longer arranged. As a result of that, the semiconductor chip CHP2 in the present first embodiment exhibits a remarkable effect that the length in the short-side direction can be reduced.

In the present first embodiment, by devising the position of arrangement of the input protection circuits 3a to 3c, the length in the short-side direction of the semiconductor chip CHP2 is reduced. Specifically, as shown in FIG. 4, at least some of the input protection circuits 3a to 3c are not arranged along the long side LS1, along which the input bump electrodes IBMP are arranged side by side. For example, the input protection circuit 3a is formed between the SRAM 2a and the SRAM 2b and the input protection circuits 3b is formed between the SRAM 2b and the SRAM 2c. Then, the input protection circuit 3c is formed between the control part 1 and the long side LS1. As a result of that, not all of the input protection circuits 3a to 3c are formed in the lower layer that overlaps the input bump electrode IBMP in a planar view. That is, in the present first embodiment, as shown in FIG. 4, in the lower layer of the input bump electrode IBMP arranged along the long side LS1, the input protection circuits 3a to 3c and the SRAMs 2a to 2c are formed as a result. Because of this, in the present first embodiment, in the lower layer of part of the input bump electrodes IBMP, the input protection circuits 3a to 3c are arranged, and on the other hand, in the lower layer of the other part of the input bump electrodes IBMP of the input bump electrodes IBMP, the input protection circuits 3a to 3c are not arranged but the SRAMs 2a to 2c (internal circuit) are arranged. In particular, in the present first embodiment, the number of part of the input bump electrodes IBMP in the lower layer of which the input protection circuits 3a to 3c are arranged is smaller than the number of the other part of the input bump electrodes IBMP in the lower layer of which the input protection circuits 3a to 3c are not arranged.

The characteristic of the present first embodiment can be expressed differently from the above, such as that part of the input protection circuits 3a, 3b are disposed in an inner region sandwiched between a region where the input bump electrodes IBMP are formed and a region where the output bump electrodes OBMP are formed. It can be expressed further, such as that part of the input protection circuits 3a to 3c are formed in a region that does not overlap the input bump electrodes IBMP in a planar view, or that part of the input protection circuits 3a, 3b are formed in a region adjacent to the SRAMs 2a to 2c in the long-side direction. Furthermore, it can be expressed, such as that part of the input protection circuits 3a, 3b electrically coupled to part of the input bump electrodes IBMP are disposed at a position that overlaps the part of the input bump electrodes in a planar view and the other input protection circuits of the input protection circuits 3a, 3b electrically coupled to the other input bump electrodes of the input bump electrodes IBMP are disposed at a position different from a position that overlaps the other input bump electrodes in a planar view.

In the present first embodiment, the input protection circuit 3a and the input protection circuit 3b are disposed between the SRAMs 2a to 2c, however, there arises a problem whether there exists a space where the input protection circuit 3a and the input protection circuit 3b can be disposed between the SRAMs 2a to 2c as described above. This is because it can be thought normally that the length in the long-side direction of the semiconductor chip CHP2 is determined so that no excess space is left in order to make an attempt to reduce in size the semiconductor chip CHP2. However, in actuality, it is possible to ensure a space into which the input protection circuit 3a and the input protection circuit 3b can be inserted between the SRAMs 2a to 2c. The reason for that will be described below.

The length in the long-side direction of the semiconductor chip CHP2 is also reduced as much as possible, however, the length in the long-side direction is regulated by the output bump electrodes OBMP arranged along the long side LS2. That is, the length in the long-side direction of the semiconductor chip CHP2 is not regulated by the SRAMs 2a to 2c or the control part 1 put side by side along the long-side direction but by the number of the output bump electrodes OBMP. For example, it can be conceived of reducing the formation region of the SRAMs 2a to 2c and the control part 1 put side by side along the long-side direction as much as possible from the standpoint of the reduction in length in the long-side direction of the semiconductor chip CHP2. Specifically, it can be conceived of reducing the space between the SRAMs 2a to 2c and the control part 1 as much as possible. However, even if the length in the long-side direction of the semiconductor chip CHP2 is reduced by densely arranging the formation regions of the SRAMs 2a to 2c and the control part 1 as described above, this attempt will be in vain if all of the output bump electrodes OBMP cannot be arranged along the long side LS2 of the semiconductor chip CHP2. Because of this, it is necessary for the length in the long-side direction of the semiconductor chip CHP2 to have at least a length that allows arrangement of all of the output bump electrodes OBMP. That is, the length in the long-side direction of the semiconductor chip CHP2 is determined from the standpoint of the possibility of arrangement of all of the output bump electrodes OBMP.

At this time, there is a problem of, for example, the relationship in magnitude between the length in the long-side direction of the SRAMs 2a to 2c and the control part 1 put side by side in the long-side direction and the total length of the output bump electrodes OBMP arranged along the long side LS2, however, in actuality, the total length of the output bump electrodes OBMP is greater than the length of the SRAMs 2a to 2c and the control part 1 put side by side.

Because of this, if the length in the long-side direction of the semiconductor chip CHP2 is determined so that all of the output bump electrodes OBMP can be arranged, there exists an excess space in the region where the SRAMs 2a to 2c and the control part 1 are put side by side. Because of this, for example, it is possible to ensure a space between the SRAMs 2a to 2c where the input protection circuit 3a and the input protection circuit 3b are inserted. Because of this, in the present first embodiment, it is possible to reduce the length in the short-side direction of the semiconductor chip CHP2 by, for example, inserting the input protection circuit 3a and the input protection circuit 3b between the SRAMs 2a to 2c.

Next, in the semiconductor chip CHP2, the output protection circuit 4 exists in addition to the input protection circuits 3a to 3c. The input protection circuits 3a to 3c and the output protection circuit 4 function as an electrostatic protection circuit that protects the internal circuit against static electricity. Then, they function as the same electrostatic protection circuit, and therefore, it can be thought that the input protection circuits 3a to 3c and the output protection circuit 4 have the same configuration. Because of this, it can be conceived of inserting the output protection circuit 4 instead of the input protection circuits 3a, 3b into the space created when the SRAMs 2a to 2c and the control part 1 are put side by side in the long-side direction. In this case also, if all of the output protection circuits 4 can be inserted into the excess space created between the SRAMs 2a to 2c and the control part 1, it is possible to reduce the length in the short-side direction of the semiconductor chip CHP2. However, in the present first embodiment, the arrangement of the output protection circuit 4 is not modified but only the arrangement of the input protection circuits 3a to 3c is modified. The reason for that will be described below.

As shown in FIG. 4, the number of the output bump electrodes OBMP is by far greater than that of the input bump electrodes IBMP. An output signal is output from each of the output bump electrodes OBMP, and therefore, it is necessary to provide the output protection circuit 4 for each of the output bump electrodes OBMP. Because of this, the number of the output protection circuits 4 is also enormously great. On the other hand, the number of the input bump electrodes IBMP is smaller than that of the output bump electrodes OBMP and it is not necessary to couple the input protection circuits 3a to 3c to all of the input bump electrodes IBMP. Of the input bump electrodes IBMP, the bump electrodes to which the input protection circuits 3a to 3c are coupled are only the bump electrodes to receive an input signal (input data). Because of this, the number of the input protection circuits 3a to 3c is smaller compared to that of the output protection circuits 4. This means that the area occupied by all of the input protection circuits 3a to 3c is smaller than that occupied by all of the output protection circuits 4. That is, the number of spaces into which the input protection circuits 3a to 3c are inserted is smaller than that of spaces into which the output protection circuits 4 are inserted.

Here, the space created when the SRAMs 2a to 2c and the control part 1 are put side by side in the long-side direction is not so large. That is, the space created when the SRAMs 2a to 2c and the control part 1 are put side by side in the long-side direction is not large enough to allow the insertion of all of the output protection circuits 4. In other words, it is not possible to make large enough the space created when the SRAMs 2a to 2c and the control part 1 are put side by side in the long-side direction, and therefore, instead of the output protection circuits 4, the input protection circuits 3a to 3c are inserted into the space described above.

Subsequently, a second characteristic point in the present first embodiment will be described. The second characteristic point in the present first embodiment is that the input protection circuits 3a to 3c are dispersed in the long-side direction of the semiconductor chips CHP2 rather than concentrated at one part, as shown in FIG. 4. For example, it can be conceived of putting together at one part the spaces created when the SRAMs 2a to 2c and the control part 1 are put side by side in the long-side direction and arranging the input protection circuits 3a to 3c in the spaces put together at one part. In this case, there is exhibited an effect that the size of the semiconductor chip can be reduced. However, the arrangement in which the input protection circuits 3a to 3c are dispersed as shown in FIG. 4 is more effective and the reason for this will be described below.

For example, it is necessary to electrically couple the input protection circuits 3a to 3c between the input bump electrode IBMP and the internal circuit. At this time, for example, in the semiconductor chip CHP1 constituting the general LCD driver shown in FIG. 1, the input protection circuit 3 is formed in the lower layer that overlaps the input bump electrode IBMP in a planar view, and therefore, it is possible to electrically couple the input bump electrode IBMP and the input protection circuit 3 using a multilayer wiring that runs from the input bump electrode IBMP toward the lower layer. This means that there is no need to use a routing wiring that extends in the direction of the plane of the semiconductor chip CHP1 in order to couple the input bump electrode IBMP to the input protection circuit 3.

In the present first embodiment, however, in the region that does not overlap the input bump electrode IBMP in a planar view, the input protection circuits 3a to 3c are formed as a result. Because of this, it is necessary to use a routing wiring that extends in the direction of the plane of the semiconductor chip CHP2 in order to couple the input bump electrodes IBMP and the input protection circuits 3a to 3c in the present first embodiment. Based on the assumption of the above, if the input protection circuits 3a to 3c are arranged together at one part, it is necessary to couple the input protection circuits 3a to 3c arranged together and the input bump electrodes IBMP arranged in the long-side direction of the semiconductor chip CHP2 using a routing wiring that extends in the direction of the plane of the semiconductor chip CHP2. In this case, if the input protection circuits 3a to 3c are concentrated at one part, the layout configuration of the routing wiring will become complicated.

Because of this, in the present first embodiment, on the assumption that the input protection circuits 3a to 3c are formed in a region that does not overlap the input bump electrodes IBMP in a planar view, the input protection circuits 3a to 3c are arranged dispersedly. Due to this, it is possible to couple each of the input bump electrodes IBMP arranged in the long-side direction of the semiconductor chip CHP2 to the input protection circuit having the shortest distance from the input bump electrode IBMP, among the input protection circuits 3a to 3c arranged dispersedly. This means that it is possible to reduce the length of a routing wiring used to couple the input bump electrode IBMP and the input protection circuits 3a to 3c and to simplify the layout configuration of the routing wiring more than that in the case where the input protection circuits 3a to 3c are concentrated at one part. Because of this, according to the present first embodiment, due to the first characteristic point that the input protection circuits 3a to 3c are arranged in the space created when the SRAMs 2a to 2c and the control part 1 are put side by side in the long-side direction, it is possible to reduce the length in the short-side direction of the semiconductor chip CHP2 constituting the LCD driver. Then, according to the first characteristic point, the input protection circuits 3a to 3c are formed in the region that does not overlap the input bump electrodes IBMP in a planar view, and further, due to the second characteristic point that the input protection circuits 3a to 3c are arranged dispersedly in the long-side direction of the semiconductor chip CHP2 rather than concentrated at one part, it is possible to simplify the layout configuration of the routing wiring used to electrically couple the input bump electrodes IBMP and the input protection circuits 3a to 3c.

Although it is desirable to comprise the first characteristic point and the second characteristic point as in the present first embodiment, it is possible to sufficiently achieve the object of the present invention to reduce the length in the short-side direction of the semiconductor chip CHP2 even with the configuration in which only the first characteristic point is comprised.

Figure 5:
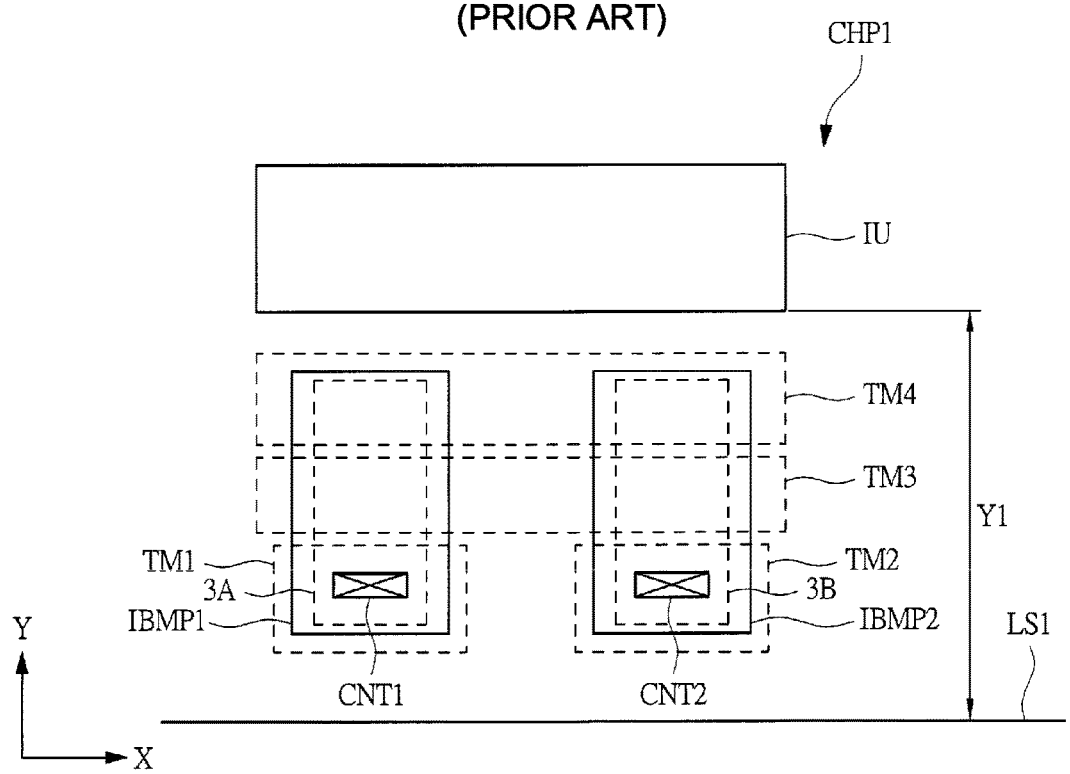
FIG. 5 is an enlarged view of a region in the vicinity of a long side of a semiconductor chip constituting a general LCD driver.

According to the semiconductor chip CHP2 in the present first embodiment, it is possible to reduce the length in the short-side direction of the semiconductor chip CHP2, and this will be described next using an enlarged view. FIG. 5 is an enlarged view of a region in the vicinity of the long side LS1 of the semiconductor chip CHP1 constituting a general LCD driver. In FIG. 5, X direction represents the long-side direction in which the long side LS1 of the semiconductor chip CHP1 extends and Y direction represents the short-side direction of the semiconductor chip CHP1. As shown in FIG. 5, along the long side LS1 of the semiconductor chip CHP1, two input bump electrodes, IBMP1 and IBMP2, are arranged side by side. Then, in the lower layer of the input bump electrode IBMP1, uppermost layer wirings TM1, TM3 and TM4 are formed. Similarly, in the lower layer of the input bump electrode IBMP2, an uppermost layer wiring TM2 and the uppermost layer wirings TM3, TM4 are formed. At this time, the uppermost layer wiring TM1 is formed only in the lower layer of the input bump electrode IBMP1 and the uppermost layer wiring TM2 is formed only in the lower layer of the input bump electrode IBMP2. On the other hand, the uppermost layer wiring TM3 and the uppermost layer wiring TM4 are formed across the lower layers of the input bump electrode IBMP1 and the input bump electrode IBMP2 and extend in the long-side direction (X direction).

The input bump electrode IBMP1 and the uppermost layer wiring TM1 are electrically coupled by filling an opening CNT1 with a conductive material. Then, the uppermost layer wiring TM1 is coupled to an input protection circuit 3A via a multilayer wiring formed in the lower layer. Similarly, the input bump electrode IBMP2 and the uppermost layer wiring TM2 are electrically coupled by filling an opening CNT2 with a conductive material. Then, the uppermost layer wiring TM2 is coupled to an input protection circuit 3B via a multilayer wiring formed in the lower layer. In the semiconductor chip CHP1 constituting a general LCD driver as described above, in the lower layers of the input bump electrodes IBMP1, IBMP2, the input protection circuits 3A, 3B are formed. Because of this, the internal circuit IU is formed at an inner side of the input bump electrodes IBMP1, IBMP2 (region farther from the long side LS1) so as not to overlap the input bump electrodes IBMP1, IBMP2 in a planar view. Because of this, the distance between the internal circuit IU and the long side LS1 of the semiconductor chip CHP1 is distance Y1.

Figure 6:
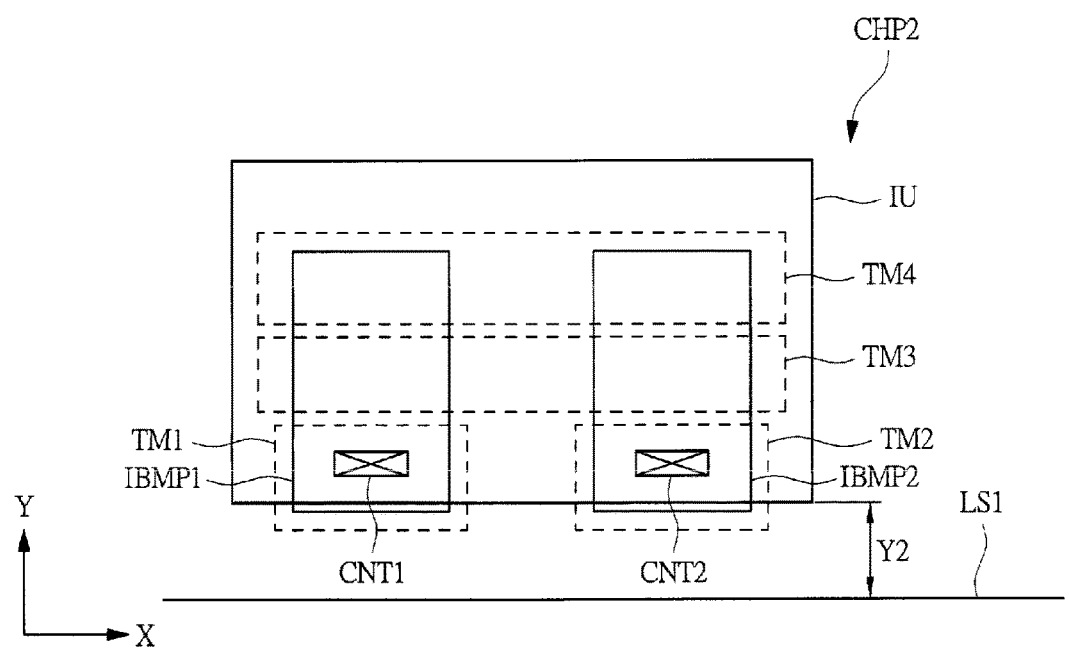
FIG. 6 is an enlarged view of a region in the vicinity of a long side on the side of an input bump electrode of a semiconductor chip, which is an LCD driver, in the first embodiment.

In contrast to this, FIG. 6 is an enlarged view of a region in the vicinity of the long side LS1 of the semiconductor chip CHP2, which is the LCD driver in the present first embodiment. In FIG. 6, the X direction represents the long-side direction in which the long side LS1 of the semiconductor chip CHP2 extends and the Y direction represents the short-side direction of the semiconductor chip CHP2. As shown in FIG. 6, along the long side LS1 of the semiconductor chip CHP2, two input bump electrodes, IBMP1 and IBMP2, are arranged side by side. Then, in the lower layer of the input bump electrode IBMP1, the uppermost layer wirings TM1, TM3, TM4 are formed. Similarly, in the lower layer of the input bump electrode IBMP2, the uppermost layer wirings TM2, TM3, TM4 are formed. At this time, the uppermost layer wiring TM1 is formed only in the lower layer of the input bump electrode IBMP1 and the uppermost layer wiring TM2 is formed only in the lower layer of the input bump electrode IBMP2. On the other hand, the uppermost layer wiring TM3 and the uppermost layer wiring TM4 are formed across the lower layers of the input bump electrode IBMP1 and the input bump electrode IBMP2 and extend in the long-side direction (X direction).

The input bump electrode IBMP1 and the uppermost layer wiring TM1 are electrically coupled by filling the opening CNT1 with a conductive material, however, in the present first embodiment, no input protection circuit is formed in the lower layer of the uppermost layer wiring TM1. Similarly, the input bump electrode IBMP2 and the uppermost layer wiring TM2 are electrically coupled by filling the opening CNT2 with a conductive material, however, in the present first embodiment, no input protection circuit is formed in the lower layer of the uppermost layer wiring TM2. In the present first embodiment, the input protection circuit (not shown schematically in FIG. 6) is formed in a region that does not overlap the input bump electrodes IBMP1, IBMP2 in a planar view. As described above, in the semiconductor chip CHP2 in the present first embodiment, no input protection circuit is formed in the lower layer of the input bump electrodes IBMP1, IBMP2, and therefore, part of the internal circuit IU is formed in the lower layer that overlaps the input bump electrodes IBMP1, IBMP2 in a planar view. As a result of this, the distance between the internal circuit IU and the long side LS1 of the semiconductor chip CHP2 is distance Y2.

Here, from the comparison between the distance Y1 shown in FIG. 5 and the distance Y2 shown in FIG. 6, it is known that the distance Y2 shown in FIG. 6 is smaller than the distance Y1 shown in FIG. 5. This means that it is possible to reduce the length in the short-side direction more in the semiconductor chip CHP2 shown in FIG. 6 than in the semiconductor chip CHP1 shown in FIG. 5. That is, according to the semiconductor chip CHP2 in the present first embodiment, it is known that the length in the short-side direction can be reduced more than that in the general semiconductor chip CHP1.

The part of the input bump electrode IBMP1 in FIG. 6 corresponds to FIG. 13 in a fifth embodiment, to be described later, and a section view cut along A-A line in FIG. 13 corresponds to FIG. 14 in the fifth embodiment, to be described later. The device structure in the present first embodiment will be described in more detail using the section view in the fifth embodiment, to be described later.

In the present first embodiment, the example is shown, in which the uppermost layer wirings TM3, TM4 pass through the lower layers of the input bump electrodes IBMP1, IBMP2, however, this is not limited, and the same effect can be obtained when at least one or more uppermost layer wirings pass through. This also applies to the following embodiments.

Second Embodiment

In the first embodiment described above, the configuration is described, in which, for example, as shown in FIG. 4, while the input protection circuits 3a to 3c are arranged in a the lower layer of part of the input bump electrodes IBMP, the input protection circuits 3a to 3c are not arranged but the SRAMs 2a to 2c (internal circuit) are arranged in the lower layer of the other input bump electrodes IBMP of the input bump electrodes IBMP.

In a second embodiment, an example will be described, where no input protection circuit is formed in the lower layer of all of the input bump electrodes IBMP.

Figure 7:
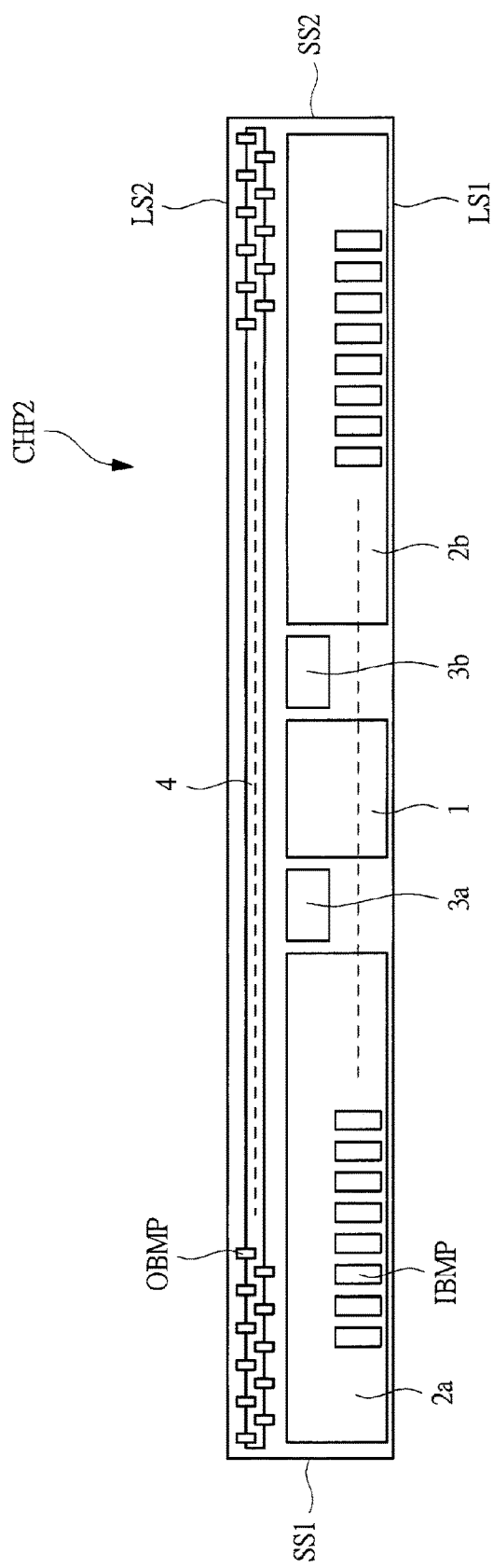
FIG. 7 is a diagram showing a configuration of a semiconductor chip constituting an LCD driver in a second embodiment.

FIG. 7 is a diagram showing a layout configuration of the semiconductor chip CHP2 in the present second embodiment. In FIG. 7, similarly to the semiconductor chip CHP2 in the above-mentioned first embodiment shown in FIG. 4, the semiconductor chip CHP2 in the present second embodiment is in the form of a rectangle having a pair of the short side SS1 and the short side SS2 and a pair of the long side LS1 and the long side LS2. Then, along the long side LS1, the input bump electrodes IBMP are arranged and along the long side LS2, the output bump electrodes OBMP are arranged. Further, the semiconductor chip CHP2 in the present second embodiment has the control part 1, the SRAMs 2a, 2b, the input protection circuits 3a, 3b, and the output protection circuit 4.

At this time, in the present second embodiment also, the input protection circuits 3a, 3b are formed in the space created when the SRAMs 2a, 2b and the control part 1 are put side by side in the long-side direction. However, the input protection circuits 3a, 3b formed in the space are formed so as not to overlap the input bump electrodes IBMP arranged along the long side LS1. That is, in the present second embodiment, unlike the above-mentioned first embodiment, no input protection circuits are formed in the lower layer of any of the input bump electrodes IBMP.

It is also possible to configure the semiconductor chip CHP2 constituting an LCD driver as in the present second embodiment. In the case of the configuration as in the present second embodiment also, due to the first characteristic point that the input protection circuits 3a, 3b are arranged in the space created when the SRAMs 2a, 2b and the control part 1 are put side by side in the long-side direction, it is possible to reduce the length in the short-side direction of the semiconductor chip CHP2 constituting the LCD driver. Then, according to the first characteristic point, the input protection circuits 3a, 3b are formed in a region that does not overlap the input bump electrodes IBMP in a planar view, and further, due to the second characteristic point that the input protection circuits 3a, 3b are arranged dispersedly in the long-side direction of the semiconductor chip CHP2 rather than concentrated at one position, it is possible to simplify the layout configuration of the routing wirings that electrically couple the input bump electrode IBMP and the input protection circuits 3a, 3b. That is, with the layout configuration in the present second embodiment, it is also possible to obtain the same effects as those obtained in the above-mentioned first embodiment.

Third Embodiment

In the above-mentioned first embodiment, as shown in FIG. 4, according to the first characteristic point that the input protection circuits 3a to 3c are arranged in the space created when the SRAMs 2a to 2c and the control part 1 are put side by side in the long-side direction, the length in the short-side direction of the semiconductor chip CHP2 constituting the LCD driver is reduced. Because of this, in the above-mentioned first embodiment, at least some of the input protection circuits 3a to 3c are formed in the region that does not overlap the input bump electrodes IBMP in a planar view as a result. Because of this, in the above-mentioned first embodiment, it is necessary to use a routing wiring that extends in the direction of the plane of the semiconductor chip CHP2 in order to electrically couple the input bump electrodes IBMP and the input protection circuits 3a to 3c. In this case, the wiring layout of the semiconductor chip CHP2 will become complicated unless the layout configuration of the routing wirings is devised.

Because of this, in the present third embodiment, a technical idea to efficiently make use of the routing wiring that extends in the direction of the plane of the semiconductor chip CHP2 will be described. That is, in the present third embodiment, when the input protection circuits 3a to 3c are formed in a region that does not overlap the input bump electrodes IBMP in a planar view, the wiring layout to electrically couple the input bump electrodes IBMP and the input protection circuits 3a to 3c is devised. A plurality of devices in the present third embodiment will be described below.

Figure 8:
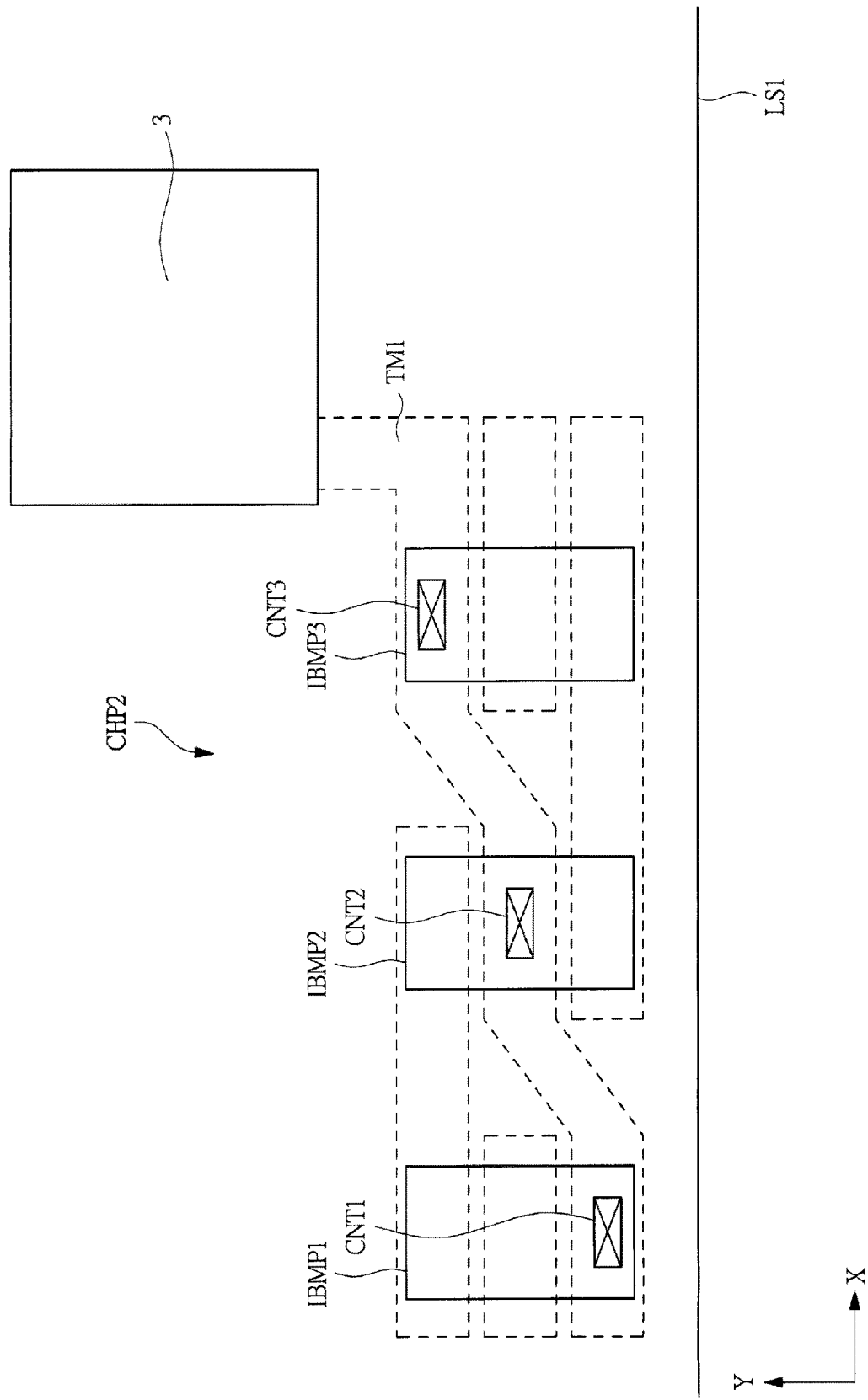
FIG. 8 is a diagram illustrating a first device point in a third embodiment.

First, a first device point in the present third embodiment will be described. FIG. 8 is a diagram for illustrating the first device point in the present third embodiment. In FIG. 8, the X direction represents the long-side direction in which the long side LS1 of the semiconductor chip CHP2 extends and the Y direction represents the short-side direction of the semiconductor chip CHP2. As shown in FIG. 8, three input bump electrodes, IBMP1, IBMP2 and IBMP3, are arranged side by side along the long side LS1 of the semiconductor chip CHP2.

Here, the first device point in the present third embodiment is, for example, a method of coupling the uppermost layer wiring TM1 electrically coupled to the input bump electrodes IBMP1 to IBMP3 and also coupled to the input protection circuit 3, and the input bump electrodes IBMP1 to IBMP3. Specifically, as shown in FIG. 8, the input bump electrode IBMP1 and the uppermost layer wiring TM1 are coupled via a conductive material filled in the opening CNT1 and the input bump electrode IBMP2 and the uppermost layer wiring TM1 are coupled via a conductive material filled in the opening CNT2. Then, the input bump electrode IBMP3 and the uppermost layer wiring TM1 are coupled via a conductive material filled in the opening CNT3. At this time, the first device point lies in that the positions where the openings CNT1 to CNT3 are formed are different.

That is, there may be a case where another uppermost layer wiring other than the uppermost layer wiring TM1 is arranged in the lower layer of the input bump electrodes IBMP1 to IBMP3. In this case, if the positions where the openings CNT1 to CNT3 are formed for the input bump electrodes IBMP1 to IBMP3 are the same, the arrangement of another uppermost layer wiring may be blocked. Because of this, according to the first device point in the present third embodiment shown in FIG. 8, the position where the opening CNT1 is formed for the input bump electrode IBMP1, the position where the opening CNT2 is formed for the input bump electrode IBMP2, and the position where the opening CNT3 is formed for the input bump electrode IBMP3 are made to differ from one another. Due to this, it is possible to form the uppermost layer wiring TM1 that extends through the lower layer of the input bump electrodes IBMP1 to IBMP3 and is coupled to the input protection circuit 3 without blocking another uppermost layer wiring to be arranged in the lower layer of the input bump electrodes IBMP1 to IBMP3.

For example, as shown in FIG. 8, the position where the opening CNT1 to be coupled to the input bump electrode IBMP1 is formed is closest to the long side LS1 of the semiconductor chip CHP2 and the position where the opening CNT3 to be coupled to the input bump electrode IBMP3 is formed is farthest from the long side LS1 of the semiconductor chip CHP2.

In FIG. 8, the input bump electrodes IBMP1 to IBMP3 are coupled by the uppermost layer wiring TM1, and therefore, the input bump electrodes IBMP1 to IBMP3 have the same function. As such a bump electrode, mention is made, for example, of the bump electrode for power supply (Vcc, Vdd). Further, this also applies when the input bump electrodes IBMP2, IBMP3 are used as a dummy bump electrode. That is, when the bump electrodes having the same purpose are adjacent to each other, it is possible to make the bump electrodes common to each other by using the uppermost layer wiring TM1 as shown in FIG. 8.

Figure 9:
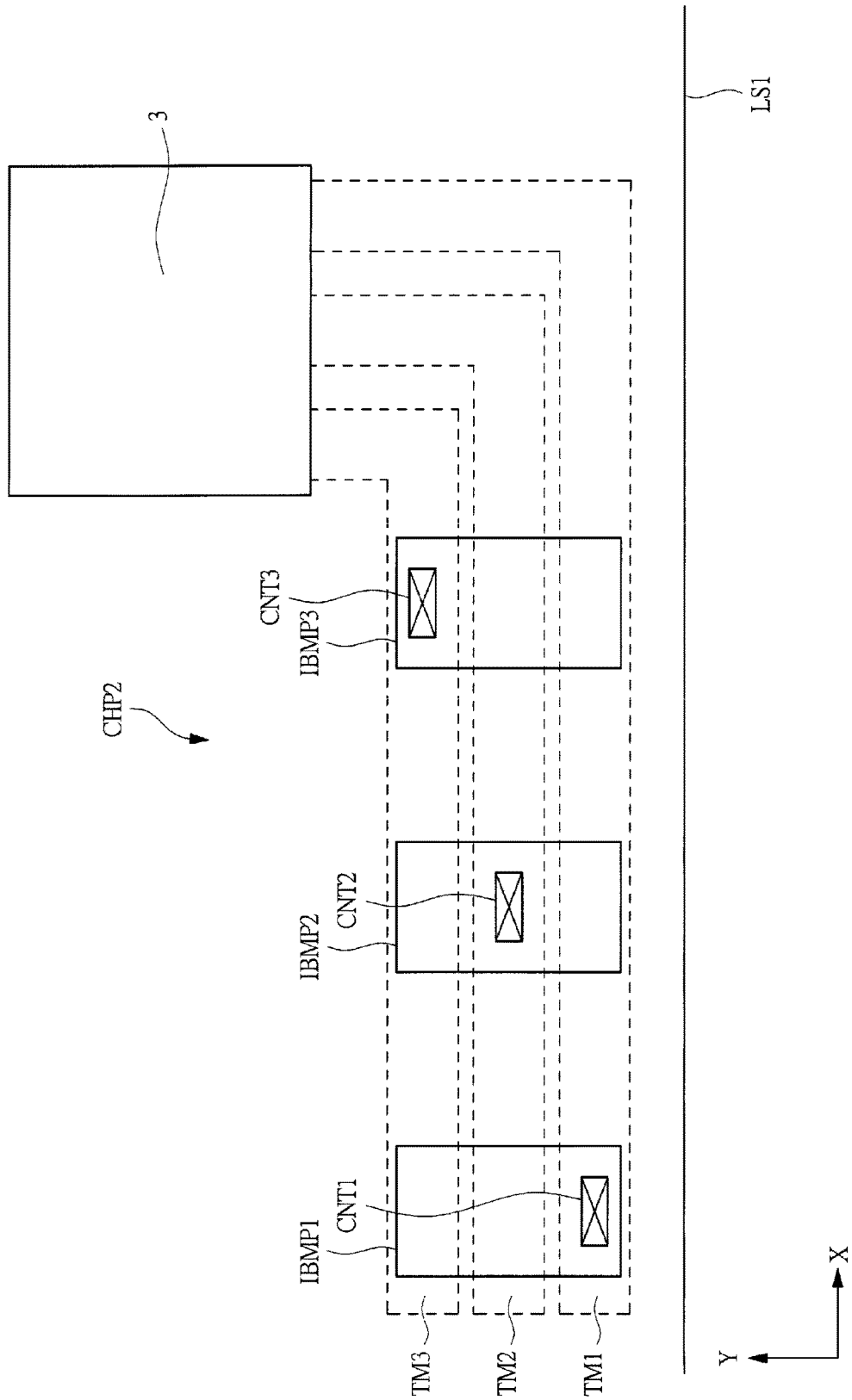
FIG. 9 is a diagram illustrating a second device point in the third embodiment.

Subsequently, a second device point in the present third embodiment will be described. FIG. 9 is a diagram for illustrating the second device point in the present third embodiment. In FIG. 9, the X direction represents the long-side direction in which the long side LS1 of the semiconductor chip CHP2 extends and the Y direction represents the short-side direction of the semiconductor chip CHP2. As shown in FIG. 9, the three input bump electrodes, IBMP1, IBMP2 and IBMP3, are arranged side by side along the long side LS1 of the semiconductor chip CHP2. Then, in the lower layer of the input bump electrodes IBMP1 to IBMP3, the uppermost layer wirings TM1 to TM3 are arranged and these uppermost layer wirings TM1 to TM3 are coupled to the input protection circuit 3.

Here, the input bump electrode IBMP1 and the uppermost layer wiring TM1 are coupled via a conductive material filled in the opening CNT1 and the input bump electrode IBMP2 and the uppermost layer wiring TM2 are coupled via a conductive material filled in the opening CNT2. Further, the input bump electrode IBMP3 and the uppermost layer wiring TM3 are coupled via a conductive material filled in the opening CNT3. This is the second device point in the present third embodiment.

That is, according to the second device point in the present third embodiment, the uppermost layer wirings TM1 to TM3 different from one another are coupled to the input bump electrodes IBMP1 to IBMP3 different from one another, respectively, and the positions where the openings CNT1 to CNT3 for the input bump electrodes IBMP1 to IBMP3 are formed are made to differ from one another. By forming the respective openings CNT1 to CNT3 to be coupled to the input bump electrodes IBMP1 to IBMP3 different from one another at different positions as described above, it is possible to efficiently couple the uppermost layer wirings TM1 to TM3 and the input bump electrodes IBMP1 to IBMP3, respectively, without the need to modify the wiring layout of the uppermost layer wirings TM1 to TM3.

Specifically, due to the second device point in the present third embodiment, the uppermost layer wirings include the uppermost layer wiring TM1 which is coupled to the input bump electrode IBMP1 via the opening CNT1, and passes under the input bump electrode IBMP2, and which is not coupled to the input bump electrode IBMP2, and the uppermost layer wiring TM2 which is coupled to the input bump electrode IBMP2 via the opening CNT2, and passes under the input bump electrode IBMP1, and which is not coupled to the input bump electrode IBMP1. Further, the uppermost layer wirings also include the uppermost layer wiring TM3 which passes under the input bump electrode IBMP1 and the input bump electrode IBMP2 and is not coupled to the input bump electrode IBMP1 or the input bump electrode IBMP2.

Figure 10:
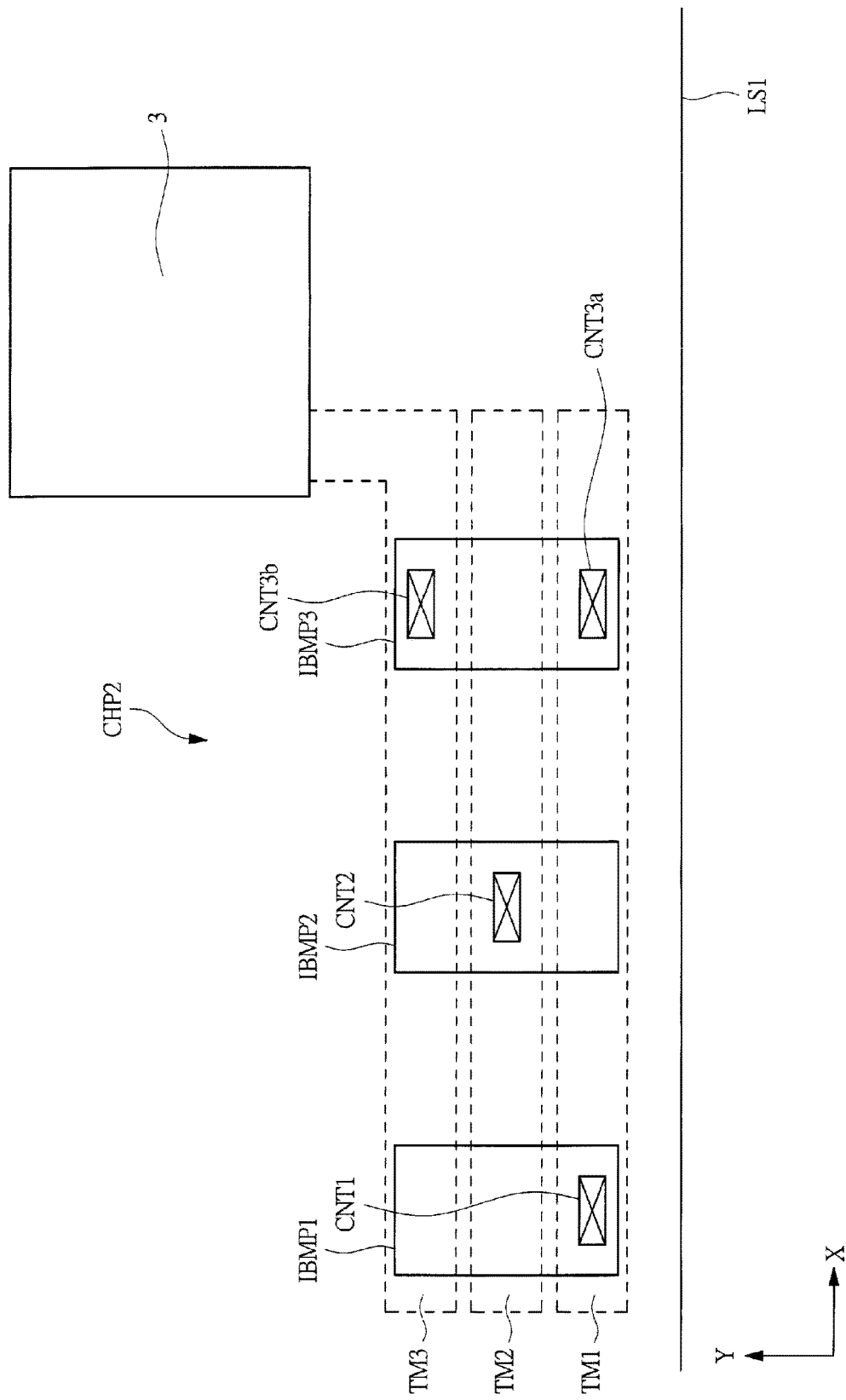
FIG. 10 is a diagram illustrating a third device point in the third embodiment.

Next, a third device point in the present third embodiment will be described. FIG. 10 is a diagram for illustrating the third device point in the present third embodiment. In FIG. 10, the X direction represents the long-side direction in which the long side LS1 of the semiconductor chip CHP2 extends and the Y direction represents the short-side direction of the semiconductor chip CHP2. As shown in FIG. 10, the three input bump electrodes, IBMP1, IBMP2 and IBMP3, are arranged side by side along the long side LS1 of the semiconductor chip CHP2. Then, in the lower layer of the input bump electrodes IBMP1 to IBMP3, the uppermost layer wirings TM1 to TM3 are arranged and the uppermost layer wiring TM3 of these uppermost layer wirings TM1 to TM3 is coupled to the input protection circuit 3.

Here, the input bump electrode IBMP1 and the uppermost layer wiring TM1 are coupled via a conductive material filled in the opening CNT1 and the input bump electrode IBMP2 and the uppermost layer wiring TM2 are coupled via a conductive material filled in the opening CNT2. Then, the input bump electrode IBMP3 and the uppermost layer wiring TM3 are coupled via a conductive material filled in an opening CNT3$b$. Further, the input bump electrode IBMP3 is also coupled to the uppermost layer wiring TM1 via a conductive material filled in an opening CNT3$a$. That is, the third device point in the present third embodiment lies in that, for example, the coupling of an input bump electrode to a plurality of different uppermost layer wirings like the input bump electrode IBMP3 that is coupled to the plurality of the different uppermost layer wirings TM1, TM3. Specifically, to the input bump electrode IBMP3, two openings, CNT3$a$ and CNT3$b$, are coupled. Then, the input bump electrode IBMP3 and the uppermost layer wiring TM1 are coupled via a conductive material filled in the opening CNT3$a$ and the input bump electrode IBMP3 and the uppermost layer wiring TM3 are coupled via a conductive material filled in the opening CNT3$b$.

That is, the third device point in the present third embodiment lies in that the input bump electrode IBMP3 is caused to have a capability of coupling the uppermost layer wiring TM1 and the uppermost layer wiring TM3. That is, in the third device point, the input bump electrode IBMP3 functions as a wiring to couple the uppermost layer wiring TM1 and the uppermost layer wiring TM3. Due to this, it is no longer necessary to form another wiring to couple the uppermost layer wiring TM1 and the uppermost layer wiring TM3, and therefore, it is possible to make an attempt to simplify the wiring layout.

Incidentally, it is possible to adjust the configuration so that the input bump electrode (the input bump electrodes IBMP1, IBMP2) to be coupled to one opening and the input bump electrode (the input bump electrode IBMP3) to be coupled to a plurality of openings coexist in accordance with the wiring layout without the need to provide a plurality of openings to all of the input bump electrodes IBMP1 to IBMP3 as shown in FIG. 10. Further, in FIG. 10, the configuration is such that, for example, the input bump electrode IBMP3 is coupled to the two openings CNT3$a$, CNT3$b$, however, this is not limited, and such a configuration in which the input bump electrode IBMP3 is coupled to three or more openings may be accepted.

Figure 11:
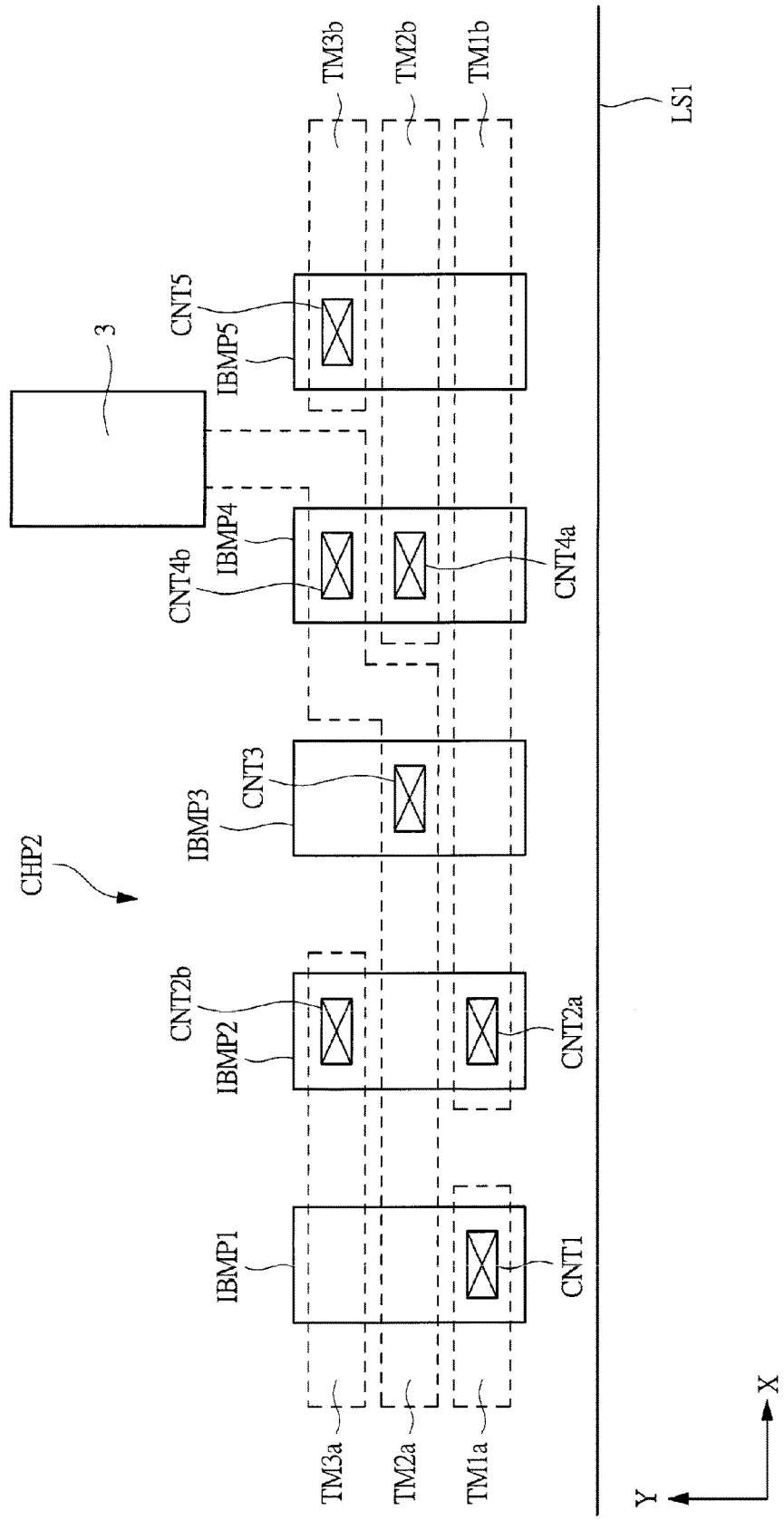
FIG. 11 is a diagram showing an example of wiring layout that has employed the first to third device points in the third embodiment.

As described above, in the present third embodiment, the first device point to the third device point are applied to the wiring layout to electrically couple the input bump electrodes IBMP and the input protection circuits 3a to 3c. An example of a wiring layout that employs the first device point to the third device point will be described below. FIG. 11 is a diagram showing an example of a wiring layout in the present third embodiment. In FIG. 11, the X direction represents the long-side direction in which the long side LS1 of the semiconductor chip CHP2 extends and the Y direction represents the short-side direction of the semiconductor chip CHP2. As shown in FIG. 11, along the long side LS1 of the semiconductor chip CHP2, five input bump electrodes, that is, the input bump electrodes IBMP1 to IBMP3 and input bump electrodes IBMP4, IBMP5 are arranged side by side. Then, in the lower layer of the input bump electrodes IBMP1 to IBMP5, uppermost layer wirings TM1a to TM3b are arranged and the uppermost layer wiring TM2a of these uppermost layer wirings TM1a to TM3b is coupled to the input protection circuit 3.

First, in the lower layer of the input bump electrode IBMP1, the uppermost layer wirings TM1a, TM2a, TM3a are arranged and the input bump electrode IBMP1 is electrically coupled to the uppermost layer wiring TM1a via a conductive material filled in the opening CNT1.

Next, in the lower layer of the input bump electrode IBMP2, the uppermost layer wirings TM1b, TM2a, TM3a are arranged. Then, the input bump electrode IBMP2 is coupled to an opening CNT2a and an opening CNT2b, and via a conductive material filled in the opening CNT2a, the input bump electrode IBMP2 is also electrically coupled to the uppermost layer wiring TM1b and at the same time, via a conductive material filled in the opening CNT2b, the input bump electrode IBMP2 is electrically coupled to the uppermost layer wiring TM3a. That is, the input bump electrode IBMP2 is coupled to the two different uppermost layer wirings TM1b, TM3a and the third device point is used in the configuration of the input bump electrode IBMP2.

Subsequently, in the lower layer of the input bump electrode IBMP3, the uppermost layer wirings TM1b, TM2a are arranged and the input bump electrode IBMP3 is electrically coupled to the uppermost layer wiring TM2a via a conductive material filled in the opening CNT3. Here, the input bump electrode IBMP1 and the input bump electrode IBMP3 are focused on. Then, the position of the opening CNT1 coupled to the input bump electrode IBMP1 is different from the position of the opening CNT3 coupled to the input bump electrode IBMP3 and the uppermost layer wiring TM1a to be coupled to the input bump electrode IBMP1 and the uppermost layer wiring TM2a to be coupled to the input bump electrode IBMP3 are different. That is, in the configuration of the input bump electrode IBMP1 and the input bump electrode IBMP3, the second device point in the present third embodiment is used.

Next, in the lower layer of the input bump electrode IBMP4, the uppermost layer wirings TM1b, TM2b, TM2a are arranged and the input bump electrode IBMP4 is coupled to the uppermost layer wiring TM2b via a conductive material filled in an opening CNT4a and coupled to the uppermost layer wiring TM2a via a conductive material filled in an opening CNT4b. Therefore, in the configuration of the input bump electrode IBMP4 also, the third device point in the present third embodiment is used. Further, the input bump electrode IBMP3 and the input bump electrode IBMP4 are focused on. Then, the input bump electrode IBMP3 and the input bump electrode IBMP4 are coupled to the same uppermost layer wiring TM2a and the position where the opening CNT3 for the input bump electrode IBMP3 is formed is different from the position where the opening CNT4b for the input bump electrode IBMP4 is formed. Therefore, the first device point in the present third embodiment is used in this configuration as a result.

Subsequently, in the lower layer of the input bump electrode IBMP5, the uppermost layer wirings TM1b, TM2b, TM3b are arranged and the input bump electrode IBMP5 is electrically coupled to the uppermost layer wiring TM3b via a conductive material filled in an opening CNT5. The wiring layout example shown in FIG. 11 is configured as described above and it can be seen that the wiring layout is made using the first device point to the third device point in the present third embodiment. By making the wiring layout as described above, it is possible to efficiently arrange the uppermost layer wirings TM1a to TM3b for the input bump electrodes IBMP1 to IBMP5, and therefore, it is possible to make an attempt to simplify the wiring layout.

The technique disclosed in the present third embodiment is also effective when forming the input protection circuits 3a to 3c in a region that overlaps the input bump electrodes IBMP in a planar view as with the prior art. Then, it is obviously possible to obtain the same effects also when using the first embodiment and the second embodiment described above in combination.

Fourth Embodiment

In a fourth embodiment, an example will be described, in which the form of the input bump electrode and the form of the output bump electrode are not the same but made to differ in size from each other.

The technical idea described in the above-mentioned third embodiment relates to the coupling configuration between the input bump electrode and the uppermost layer wiring and the effective use of the first device point to the third device point described in the above-mentioned third embodiment is based on the assumption that the uppermost layer wirings are arranged in the lower layer of the input bump electrode. Taking into consideration the assumption, in the present fourth embodiment, attention is focused on the point that the first device point to the third device point in the above-mentioned third embodiment become a more useful technique as the number of uppermost layer wirings to be arranged in the lower layer of the input bump electrode increases. Because of this, in the present fourth embodiment, the configuration of the input bump electrode is devised in order to make use of the first device point to the third device point in the above-mentioned third embodiment more effectively. A technical idea in the present fourth embodiment will be described below.

Figure 12:
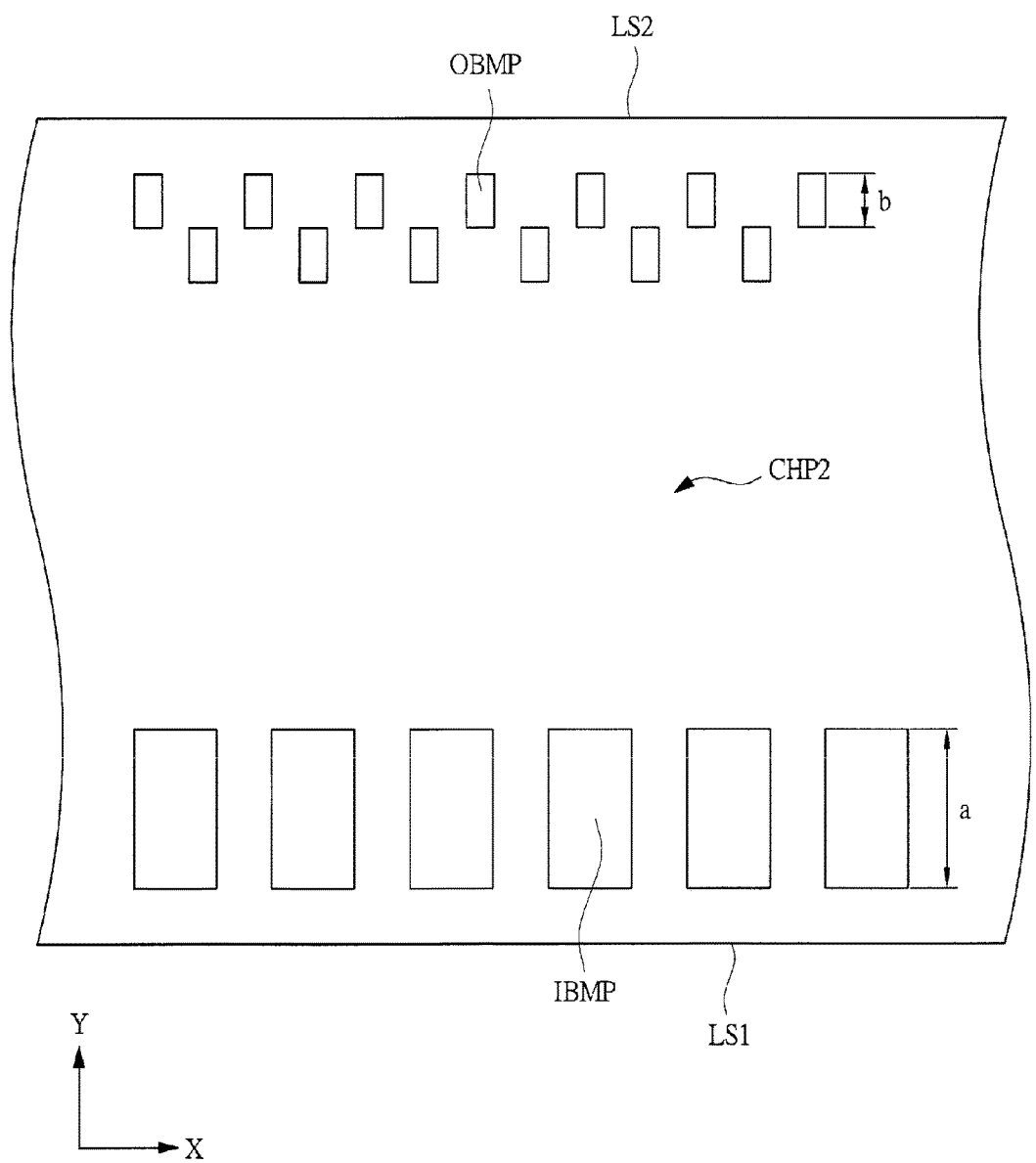
FIG. 12 is an enlarged view showing a semiconductor chip constituting an LCD driver in a fourth embodiment.

FIG. 12 is an enlarged view showing a configuration of the semiconductor chip CHP2 constituting an LCD driver. In FIG. 12, the X direction represents the long-side direction in which the long sides LS1, LS2 extend and the Y direction represents the short-side direction. As shown in FIG. 12, along the long side LS1, a plurality of input bump electrodes IBMP is arranged and along the other long side LS2 arranged at a position in opposition to the long side LS1 along which the input bump electrodes IBMP are arranged, a plurality of output bump electrodes OBMP is arranged. While the input bump electrodes IBMP are arranged linearly along the long side LS1, the output bump electrodes OBMP are arranged along the long side LS2 in two rows in a staggered manner. Because of this, the number of the output bump electrodes OBMP is greater than that of the input bump electrodes IBMP.

The characteristic in the present fourth embodiment lies in that the size of the input bump electrode IBMP is not the same as that of the output bump electrode OBMP but greater than that of the output bump electrode OBMP. More specifically, when the length in the short-side direction of the input bump electrode IBMP is assumed to be a and the length in the short-side direction of the output bump electrode OBMP b, the length a of the input bump electrode IBMP is greater than the length b of the output bump electrode OBMP. The reason for thus increasing the size of the input bump electrode IBMP is as follows.

That is, making greater the length in the short-side direction of the input bump electrode IBMP means that the number of uppermost layer wirings to be arranged in the lower layer that overlaps the input bump electrode IBMP in a planar view can be increased. That is, by making greater the length in the short-side direction of the input bump electrode IBMP, the number of uppermost layer wirings that pass through the lower layer of the input bump electrode IBMP and extend in the direction of the long side LS1 is increased. This means that the number of uppermost layer wirings that pass through the lower layer of the input bump electrodes IBMP arranged along the long side LS1 is increased and as a result of that, the degree of freedom in coupling the input bump electrodes IBMP by uppermost layer wirings is increased. Further, that the number of uppermost layer wirings that pass through the lower layer of the input bump electrodes IBMP increases means that the potential to effectively make use of the first device point to the third device point described in the above-mentioned third embodiment increases. Because of this, according to the present fourth embodiment, by employing the characteristic configuration in which the length a of the input bump electrode IBMP is made greater than the length b of the output bump electrode OBMP, a remarkable effect is exhibited that the degree of freedom in wiring layout is increased.

As described above, the present fourth embodiment employs the characteristic configuration in which the length a of the input bump electrode IBMP is made greater than the length b of the output bump electrode OBMP from the standpoint that the first device point to the third device point in the above-mentioned third embodiment are made use of effectively by increasing the degree of freedom in wiring layout. That is, the plane area of the input bump electrode IBMP is made greater than that of the output bump electrode OBMP. By employing the characteristic configuration in the present fourth embodiment, secondary effects as shown below are also exhibited. The secondary effects will be described.

For example, a case is considered, where the size of the input bump electrode IBMP and the size of the output bump electrode OBMP are the same. In this case, the number of the input bump electrodes IBMP is smaller than that of the output bump electrodes OBMP, and therefore, the total area of the input bump electrodes IBMP is smaller than that of the output bump electrodes OBMP.

The input bump electrode IBMP and the output bump electrode OBMP formed in the semiconductor chip CHP2 function as a coupling terminal when mounting the semiconductor chip CHP2, which is an LCD driver, over the glass substrate of a liquid crystal display device. At this time, that the total area of the input bump electrode IBMP is smaller than that of the output bump electrode OBMP means that the joint area on the side of the input bump electrode IBMP is smaller than that on the side of the output bump electrode OBMP. Because of this, the joint area along the long side LS1 of the semiconductor chip CHP2 (total area of the input bump electrode IBMP) and that along the long side LS2 of the semiconductor chip CHP2 (total area of the output bump electrode OBMP) are different. As a result of that, when mounting the semiconductor chip CHP2 over the glass substrate, the balance between the joint strength at the long side LS1 of the semiconductor chip CHP2 and that at the long side LS2 of the semiconductor chip CHP2 is lost and there arises a possibility that the joint strength between the semiconductor chip CHP2 and the glass substrate is reduced.

In contrast to this, a case is considered, where the characteristic configuration in which the length a of the input bump electrode IBMP is made greater than the length b of the output bump electrode OBMP is employed as in the present fourth embodiment. In this case, the number of the input bump electrodes IBMP is smaller than that of the output bump electrodes OBMP, however, the size of one input bump electrode IBMP is greater than that of one output bump electrode OBMP. Consequently, the difference between the total area of the input bump electrodes IBMP and that of the output bump electrodes OBMP becomes smaller compared to the case where the size of the input bump electrode IBMP and that of the output bump electrode OBMP are the same in dimensions. That is, according to the characteristic configuration in the present fourth embodiment, it is possible to make smaller the difference between the joint area on the side of the input bump electrode IBMP and that on the side of the output bump electrode OBMP. As a result of that, the imbalance between the joint strength at the long side LS1 of the semiconductor chip CHP2 and that at the long side LS2 of the semiconductor chip CHP2 is relaxed when mounting the semiconductor chip CHP2 over the glass substrate, and therefore, the joint strength between the semiconductor chip CHP2 and the glass substrate is increased.

In the present fourth embodiment, the length in the Y direction (short-side direction of the semiconductor chip CHP2) is illustrated, however as to the length in the X direction (long-side direction of the semiconductor chip CHP2), it is desirable to make the same the length of the input bump electrode IBMP and that of the output bump electrode OBMP, or to make greater the length of the input bump electrode IBMP than that of the output bump electrode OBMP.

As described above, according to the characteristic configuration in the present fourth embodiment, it is possible to obtain the effect that the joint strength between the semiconductor chip CHP2 and the glass substrate is increased as well as the effect that the degree of freedom in wiring layout is increased.

The technique disclosed in the present fourth embodiment is not limited to the case in the third embodiment described above and can also be applied to the first and second embodiments described above.

Fifth Embodiment

In a fifth embodiment, a device structure formed in the lower layer of the input bump electrode will be described. FIG. 13 is a diagram showing one input bump electrode IBMP1. In FIG. 13, the direction in which the long side LS1 of the semiconductor chip CHP2 extends is referred to as the X direction and the short-side direction of the semiconductor chip CHP2 is referred to as the Y direction. As shown in FIG. 13, the input bump electrode IBMP1 is in the form of a rectangle and in the lower layer of the input bump electrode IBMP1, the three uppermost layer wirings TM1 to TM3 are arranged. The input bump electrode IBMP1 is electrically coupled to the uppermost layer wiring TM1 via a conductive material filled in the opening CNT1. A device structure formed in the lower layer of the input bump electrode IBMP1 thus configured will be described with reference to FIG. 14.

Figure 13:
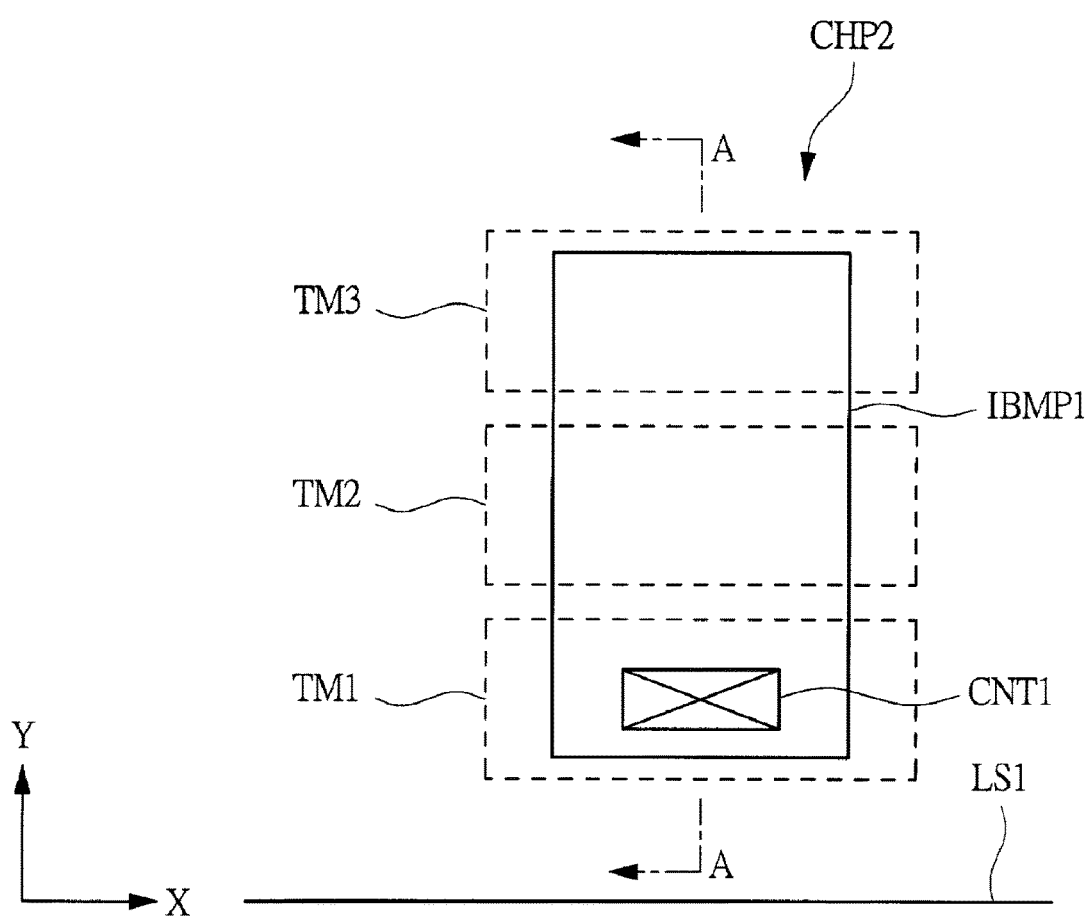
FIG. 13 is a diagram showing one input bump electrode in a fifth embodiment.
Figure 14:
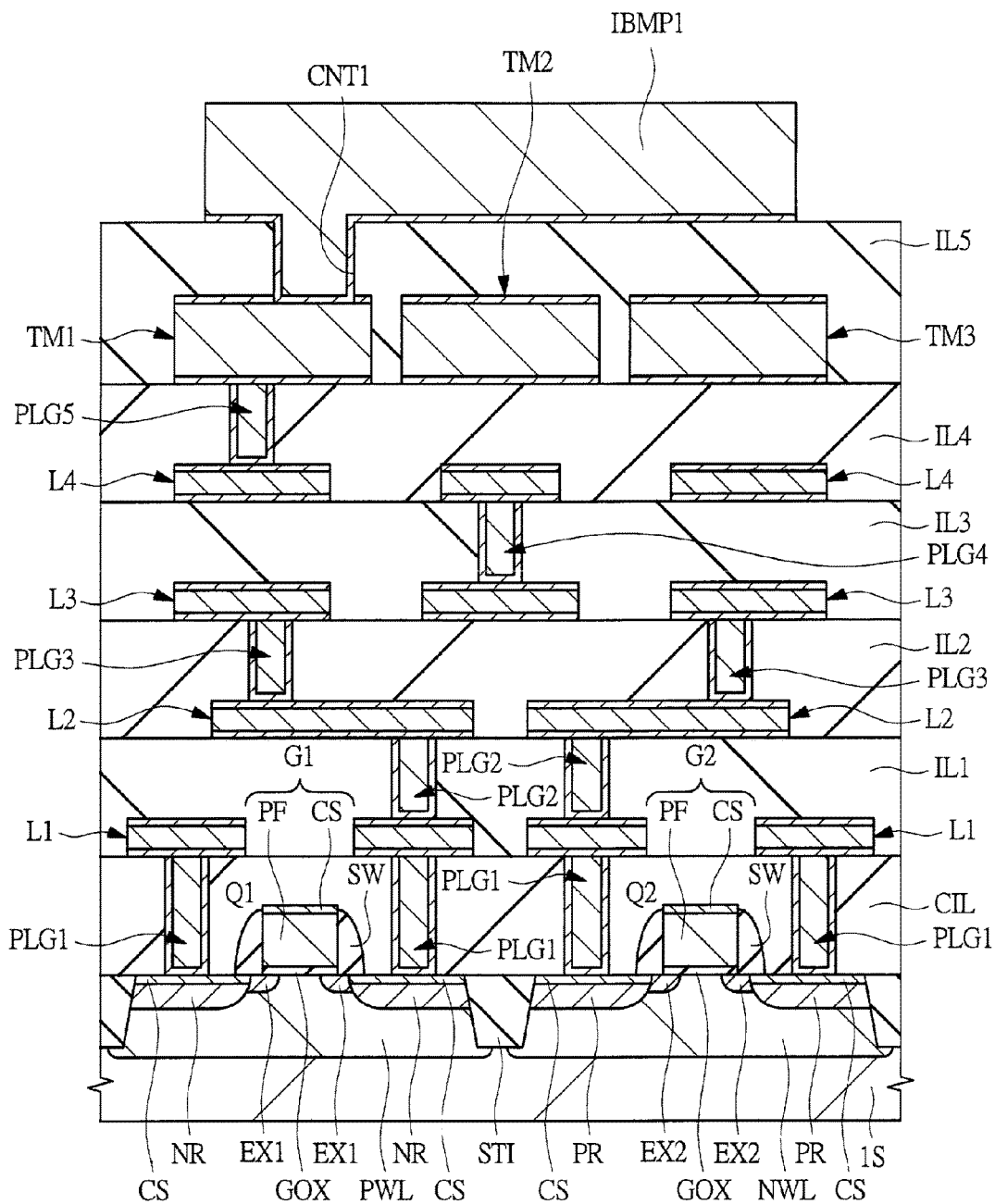
FIG. 14 is a section view cut along A-A line in FIG. 13.

FIG. 14 is a section view cut along A-A line in FIG. 13, a section view showing a configuration of a semiconductor device in the present fifth embodiment. In the present fifth embodiment, for example, as shown in FIG. 4 in the above-mentioned first embodiment, the internal circuit (for example, SRAMs 2a to 2c) is formed in the lower layer of the input bump electrode IBMP. Consequently, in the semiconductor substrate in the lower layer of the input bump electrode IBMP, an n-channel type MISFET and a p-channel type MISFET constituting the SRAMs 2a to 2c are formed. In the following, a device structure will be described on the assumption that the n-channel type MISFET and the p-channel type MISFET constituting the SRAMs 2a to 2c are formed in the lower layer of the input bump electrode IBMP. That is, the semiconductor device in the present fifth embodiment has an n-channel type MISFET Q1 and a p-channel type MISFET Q2 and the respective configurations thereof will be described.

In a semiconductor substrate 1S, an element isolation region STI that separates elements is formed and in a region (within the semiconductor substrate 1S) in which the n-channel type MISFET Q1 is formed among active regions divided by the element isolation region STI, a p-type well PWL is formed and in a region (within the semiconductor substrate 1S) in which the p-channel type MISFET Q2 is formed, an n-type well NWL is formed.

The n-channel type MISFET Q1 has a gate insulating film GOX over the p-type well PWL formed within the semiconductor substrate 1S, and over the gate insulating film GOX, a gate electrode G1 is formed. The gate insulating film GOX is formed from, for example, a silicon oxide film and the gate electrode G1 is formed from, for example, a laminated film of a polysilicon film PF and a cobalt silicide film CS, in order to reduce resistance.

However, the gate insulating film GOX is not limited to the silicon oxide film, but can be modified in various ways, and the gate insulating film GOX may be formed from, for example, a silicon oxynitride film (SiON). That is, it may have a structure in which nitrogen is segregated at the interface between the gate insulating film GOX and the semiconductor substrate 1S. The silicon oxynitride film has a significant effect for suppressing the occurrence of interface state in the film and reducing electron trap compared to the silicon oxide film. As a result, it is possible to improve the hot-carrier resistance of the gate insulating film GOX and the insulation resistance. In addition, it is difficult for impurities to penetrate through the silicon oxynitride film, compared to the silicon oxide film. Because of this, by using a silicon oxynitride film as the gate insulating film GOX, it is possible to suppress the variations in the threshold voltage resulting from the diffusion of impurities in the gate electrode to the side of the semiconductor substrate 1S. In order to form a silicon oxynitride film, for example, it is only required to perform heat treatment on the semiconductor substrate 1S in an atmosphere containing nitrogen, such as NO, $NO_2$, and $NH_3$. It is also possible to obtain the same effect by performing heat treatment on the semiconductor substrate 1S in an atmosphere containing nitrogen after forming the gate insulating film GOX including a silicon oxide film on the surface of the semiconductor substrate 1S, and segregating nitrogen to the interface between the gate insulating film GOX and the semiconductor substrate 1S.

Further, it may also be possible to form the gate insulating film GOX from, for example, a high-k dielectric film having the dielectric constant higher than that of the silicon oxide film. Conventionally, from the standpoint that the insulation resistance is high, the electrical/physical stability at the interface between silicon and silicon oxide is excellent, etc., a silicon oxide film is used as the gate insulating film GOX. However, it has been demanded for the gate insulating film GOX to be extremely thin accompanying the miniaturization of element. If such a thin silicon oxide film is used as the gate insulating film GOX, a so-called tunneling current is generated by electrons that flow through the channel of MISFET, tunneling the barrier wall formed by the silicon oxide film and flowing to the gate electrode.

Because of this, a material having a dielectric constant higher than that of the silicon oxide film is used and a high-k dielectric film begins to be used recently, which has the same capacitance but is capable of increasing the physical film thickness. With a high-k dielectric film, it is possible to increase the physical film thickness with the same capacitance, and therefore, the leak current can be reduced. In particular, although the silicon nitride film has a dielectric constant higher than that of the silicon oxide film, it is desirable to use a high-k dielectric film having a dielectric constant higher than that of the silicon nitride film in the present fifth embodiment.

For example, as a high-k dielectric film having a dielectric constant higher than that of the silicon nitride film, a hafnium oxide film ($HfO_2$ film) is used, which is one of hafnium oxides, however, instead of the hafnium oxide film, other hafnium-based insulating films, such as a HfAlO film (hafnium aluminate film), a HfON film (hafnium oxynitride film), a HfSiO film (hafnium silicate film), and a HfSiON film (hafnium silicon oxynitride film) can be used. Further, hafnium-based insulating films that have introduced oxides therein, such as tantalum oxide, niobium oxide, titanium oxide, zirconium oxide, lanthanum oxide, and yttrium oxide, can also be used. Because the hafnium-based insulating film has a dielectric constant higher than that of the silicon oxide film and the silicon oxynitride film, like the hafnium oxide film, the same effect when the hafnium oxide film is used can be obtained.

On the side wall on both sides of the gate electrode G1, a sidewall SW is formed and within the semiconductor substrate 1S under the sidewall SW, a shallow n-type impurity diffusion region EX1 is formed as a semiconductor region. The sidewall SW is formed by, for example, an insulating film, such as a silicon oxide film. Then, outside the shallow n-type impurity diffusion region EX1, a deep n-type impurity diffusion region NR is formed and on the surface of the deep n-type impurity diffusion region NR, the cobalt silicide film CS is formed.

The sidewall SW is formed so that the source region and the drain region, which are the semiconductor region of the n-channel type MISFET Q1, have an LDD structure. That is, the source region and the drain region of the n-channel type MISFET Q1 are formed by the shallow n-type impurity diffusion region EX1 and the deep n-type impurity diffusion region NR. At this time, the impurity concentration of the shallow n-type impurity diffusion region EX1 is lower than that of the deep n-type impurity diffusion region NR. Because of this, by forming the source region and the drain region under the sidewall SW as the shallow n-type impurity diffusion region EX1, it is possible to suppress electric field under the end part of the gate electrode G1 from concentrating.

Next, the p-channel type MISFET Q2 has the gate insulating film GOX over the n-type well NWL formed within the semiconductor substrate 1S and over the gate insulating film GOX, a gate electrode G2 is formed. The gate insulating film GOX is formed by, for example, a silicon oxide film, and the gate electrode G2 is formed by, for example, a laminated film of the polysilicon film PF and the cobalt silicide film CS to reduce resistance. At this time, in the p-channel type MISFET Q2 also, the gate insulating film GOX is not limited to a silicon oxide film but it may also be possible to use a silicon oxynitride film or a high-k dielectric film having a dielectric constant higher than that of a silicon oxide film, like the n-channel type MISFET Q1.

On the side wall on both sides of the gate electrode G2, the sidewall SW is formed and within the semiconductor substrate 1S under the sidewall SW, a shallow p-type impurity diffusion region EX2 is formed as a semiconductor region. The sidewall SW is formed by, for example, an insulating film, such as a silicon oxide film. Then, outside the shallow p-type impurity diffusion region EX2, a deep p-type impurity diffusion region PR is formed and on the surface of the deep p-type impurity diffusion region PR, the cobalt silicide film CS is formed.

The sidewall SW is formed so that the source region and the drain region, which are the semiconductor region of the p-channel type MISFET Q2, have an LDD structure. That is, the source region and the drain region of the p-channel type MISFET Q2 are formed by the shallow p-type impurity diffusion region EX2 and the deep p-type impurity diffusion region PR. At this time, the impurity concentration of the shallow p-type impurity diffusion region EX2 is lower than that of the deep p-type impurity diffusion region PR. Because of this, by forming the source region and the drain region under the sidewall SW as the shallow p-type impurity diffusion region EX2 of low concentration, it is possible to suppress the electric field under the end part of the gate electrode G2 from concentrating.

As described above, over the semiconductor substrate 1S, the n-channel type MISFET Q1 and the p-channel type MISFET Q2 are formed. For example, a contact interlayer insulating film CIL including a silicon oxide film is formed so as to cover the n-channel type MISFET Q1 and the p-channel type MISFET Q2 and a contact hole is formed so as to penetrate through the contact interlayer insulating film CIL. The contact hole is formed so as to reach the source region and the drain region of the n-channel type MISFET Q1 and the source region and the drain region of the p-channel type MISFET Q2 and a plug PLG1 is formed within the contact hole. The plug PLG1 is formed by filling the contact hole with a barrier conductive film including, for example, a titanium/titanium nitride film (a titanium film and a titanium nitride film formed over the titanium film) and a tungsten film.

Specifically, the contact interlayer insulating film CIL is formed by a laminated film of an ozone TEOS film formed by the thermal CVD method using ozone and TEOS as a raw material and a plasma TEOS film formed by the plasma CVD method using TEOS as a raw material. It may also be possible to form, for example, an etching stopper film including a silicon nitride film in the lower layer of the ozone TEOS film.

The contact interlayer insulating film CIL is formed by a TEOS film because the TEOS film is a film excellent in the coverage for the backing step. The backing that forms the contact interlayer insulating film CIL is the semiconductor substrate over which MISFET is formed and which has bumps and dips. That is, because MISFET is formed over the semiconductor substrate 1S, on the surface of the semiconductor substrate 1S, a gate electrode is formed, and therefore, the backing has bumps and dips. Consequently, unless a film is excellent in coverage for a step with bumps and dips, it is not possible to flatten the fine bumps and dips, resulting in the occurrence of voids etc. Because of this, a TEOS film is used as the contact interlayer insulating film CIL. This is because, in a TEOS film that uses TEOS as a raw material, before TEOS, which is a raw material, becomes a silicon oxide film, it forms an intermediate, facilitating movement on the surface of a film being formed, and therefore, the coverage properties for the backing step are improved.

The titanium/titanium nitride film constituting a barrier conductive film is a film provided to prevent tungsten constituting the tungsten film from diffusing into silicon and also to prevent fluorine from attacking the contact interlayer insulating film CIL and the semiconductor substrate 1S to inflict damage on them in the CVD method in which $WF_6$ (tungsten fluoride) is subjected to reduction processing when the tungsten film is formed.

Next, over the contact interlayer insulating film CIL in which the plug PLG1 is formed, a multilayer wiring is formed. The structure of the multilayer wiring will be described below. As shown in FIG. 14, over the plug PLG1 formed in the contact interlayer insulating film CIL, a first layer wiring L1 is formed. The first layer wiring L1 is formed by, for example, a laminated film including a titanium nitride film, an aluminum film, and a titanium nitride film. Then, over the contact interlayer insulating film CIL over which the first layer wiring L1 is formed, an interlayer insulating film IL1 that covers the first layer wiring L1 is formed. The interlayer insulating film IL1 is formed by, for example, a silicon oxide film. In the interlayer insulating film IL1, a plug PLG2 that reaches the first layer wiring L1 is formed. This plug PLG2 is also formed by embedding a barrier conductive film including a titanium/titanium nitride film and a tungsten film.

Subsequently, over the plug PLG2 formed in the interlayer insulating film IL1, a second layer wiring L2 is formed. The second layer wiring L2 is formed by, for example, a laminated film including a titanium nitride film, an aluminum film, and a titanium nitride film. Then, over the interlayer insulating film IL1 over which the second layer wiring L2 is formed, an interlayer insulating film IL2 that covers the second layer wiring L2 is formed. The interlayer insulating film IL2 is formed by, for example, a silicon oxide film. In the interlayer insulating film IL2, a plug PLG3 that reaches the second layer wiring L2 is formed. This plug PLG3 is also formed by embedding a barrier conductive film including a titanium/titanium nitride film and a tungsten film.

Next, over the plug PLG3 formed in the interlayer insulating film IL2, a third layer wiring L3 is formed. The third layer wiring L3 is formed by, for example, a laminated film including a titanium nitride film, an aluminum film, and a titanium nitride film. Then, over the interlayer insulating film IL2 over which the third layer wiring L3 is formed, an interlayer insulating film IL3 that covers the third layer wiring L3 is formed. The interlayer insulating film IL3 is formed by, for example, a silicon oxide film. In the interlayer insulating film IL3, a plug PLG4 that reaches the third layer wiring L3 is formed. This plug PLG4 is also formed by embedding a barrier conductive film including a titanium/titanium nitride film and a tungsten film.

Subsequently, over the plug PLG4 formed in the interlayer insulating film IL3, a fourth layer wiring L4 is formed.

The fourth layer wiring L4 is formed by, for example, a laminated film including a titanium nitride film, an aluminum film, and a titanium nitride film. Then, over the interlayer insulating film IL3 over which the fourth layer wiring L4 is formed, an interlayer insulating film IL4 that covers the fourth layer wiring L4 is formed. The interlayer insulating film IL4 is formed by, for example, a silicon oxide film. In the interlayer insulating film IL4, a plug PLG5 that reaches the fourth layer wiring L4 is formed. This plug PLG5 is also formed by embedding a barrier conductive film including a titanium/titanium nitride film and a tungsten film.

The multilayer wiring is formed as described above. In the present fifth embodiment, the multilayer wiring is formed by an aluminum film, however, it may also be possible to form the multilayer wiring by a copper film. That is, the first layer wiring L1 to the fourth layer wiring L4 may be formed by a conductive film containing copper as its main component, such as a damascene wiring. That is, after a groove is formed in each of the interlayer insulating film IL1 to the interlayer insulating film IL4, a conductive film containing copper as its main component is formed inside and outside the groove. Then, it is also possible to obtain a structure in which a conductive film is embedded within the groove by polishing the conductive film outside the groove by the chemical mechanical polishing (CMP) method etc. Specifically, the multilayer wiring may be formed from copper (Cu) or copper alloy (alloy of copper (Cu) and aluminum (Al), magnesium (Mg), titanium (Ti), manganese (Mn), iron (Fe), zinc (Zn), zirconium (Zr), niobium (Nb), molybdenum (Mo), ruthenium (Ru), palladium (Pd), silver (Ag), gold (Au), indium (In), lanthanoid-based metal, actinoid-based metal, etc.).

Further, the interlayer insulating films IL1 to IL4 may be formed by a low dielectric constant film having a dielectric constant lower than that of a SiOF film. Specifically, the interlayer insulating films IL1 to IL4 may be formed by either of a SiOC film having vacancies, a MSQ film having vacancies (methylsilsesquioxane, a silicon oxide film formed by an application step and having a Si—C bond, or a silsesquioxane containing carbon), a HSQ film having vacancies (hydrogen silsesquioxane, a silicon oxide film formed by an application step and having a Si—H bond, or silsesquioxane containing hydrogen). The size (diameter) of a vacancy is, for example, about 1 nm.

Next, over the plug PLG5 formed in the interlayer insulating film IL4, the uppermost layer wirings TM1, TM2, TM3 are formed. The uppermost layer wirings TM1, TM2, TM3 are formed by, for example, a laminated film including a titanium nitride film, an aluminum film, and a titanium nitride film. Then, over the interlayer insulating film IL4 over which the uppermost layer wirings TM1, TM2, TM3 are formed, an interlayer insulating film (surface protection film) IL5 is formed so as to cover the uppermost layer wirings TM1, TM2, TM3. The interlayer insulating film IL5 is formed by, for example, a laminated film including a silicon oxide film and a silicon nitride film formed over the silicon oxide film.

Further, in the interlayer insulating film IL5, the opening CNT1 that reaches the uppermost layer wiring TM1 is formed and a conductive material is filled in the opening CNT1. The input bump electrode IBMP1 is formed over the interlayer insulating film IL5 in which the opening CNT1 is formed. The input bump electrode IBMP1 is formed by an under bump metal (UBM) film, which is a backing film, and a gold film formed over the UBM film. The UBM film may be formed by using, for example, the sputtering method and formed by, for example, a single layer film, such as a titanium film, a nickel film, a palladium film, a titanium/tungsten alloy film, a titanium nitride film, and a gold film, or a laminated film thereof. Here, the UBM film is a film having a barrier function to suppress or prevent metal elements of the gold film from moving to the side of the multilayer wiring or conversely, the metal elements of the multilayer wiring from moving to the side of the gold film, in addition to a function to improve adhesion between the input bump electrode IBMP1 and the surface protection film (interlayer insulating film IL5).

The semiconductor device in the present fifth embodiment is formed as described above. At this time, the three uppermost layer wirings TM1, TM2, TM3 are formed in the lower layer that overlaps the input bump electrode IBMP1 in a planar view as a result.

Figure 15:
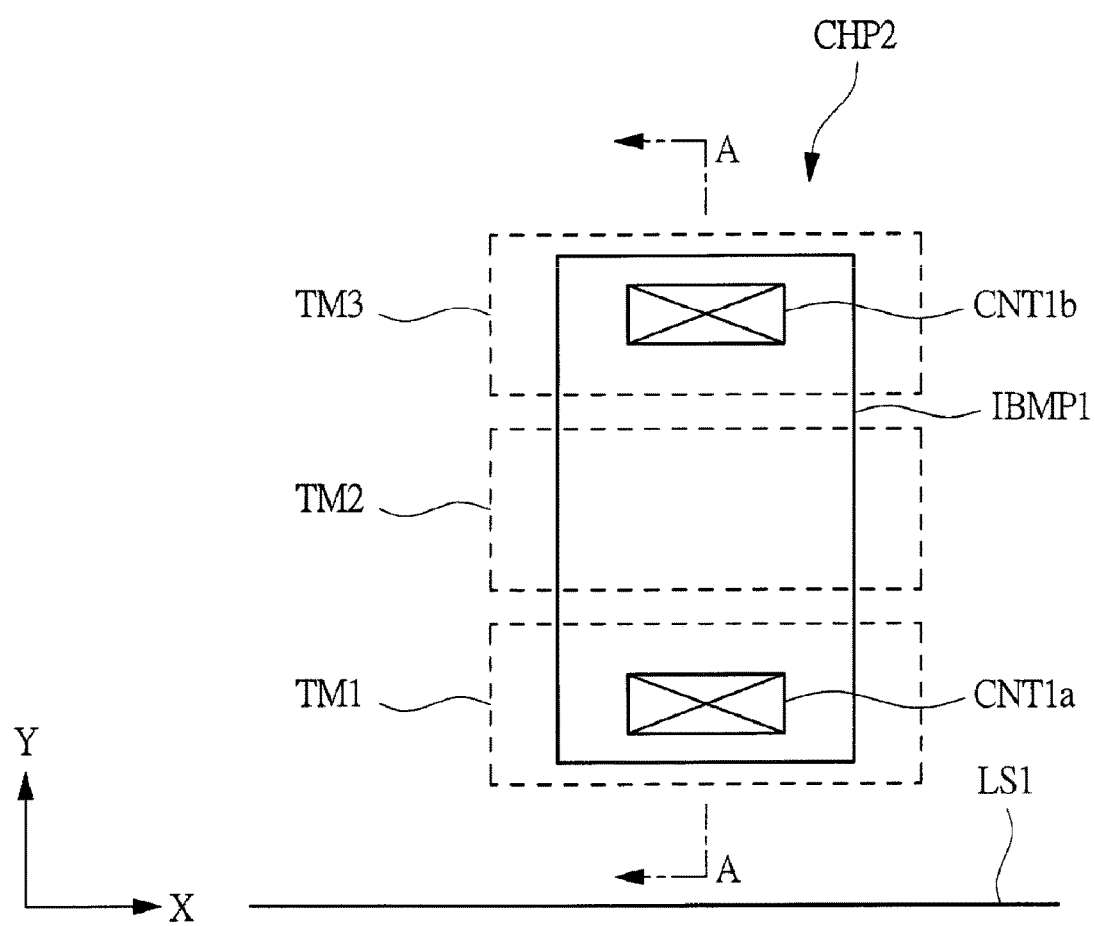
FIG. 15 is a diagram showing one input bump electrode in the fifth embodiment.

Subsequently, for example, a structure in which two openings are coupled to one input bump electrode IBMP will be described. FIG. 15 is a diagram showing one input bump electrode IBMP1. In FIG. 15, the direction in which the long side LS1 of the semiconductor chip CHP2 extends is referred to as the X direction and the short-side direction of the semiconductor chip CHP2 is referred to as the Y direction. As shown in FIG. 15, the input bump electrode IBMP1 is in the form of a rectangle and in the lower layer of the input bump electrode IBMP1, the three uppermost layer wirings TM1 to TM3 are arranged. The input bump electrode IBMP1 is electrically coupled to the uppermost layer wiring TM1 via a conductive material filled in an opening CNT1a and electrically coupled also to the uppermost layer wiring TM3 via a conductive material filled in an opening CNT1b. A device structure formed in the lower layer of the input bump electrode IBMP1 thus configured will be described with reference to FIG. 16.

Figure 16:
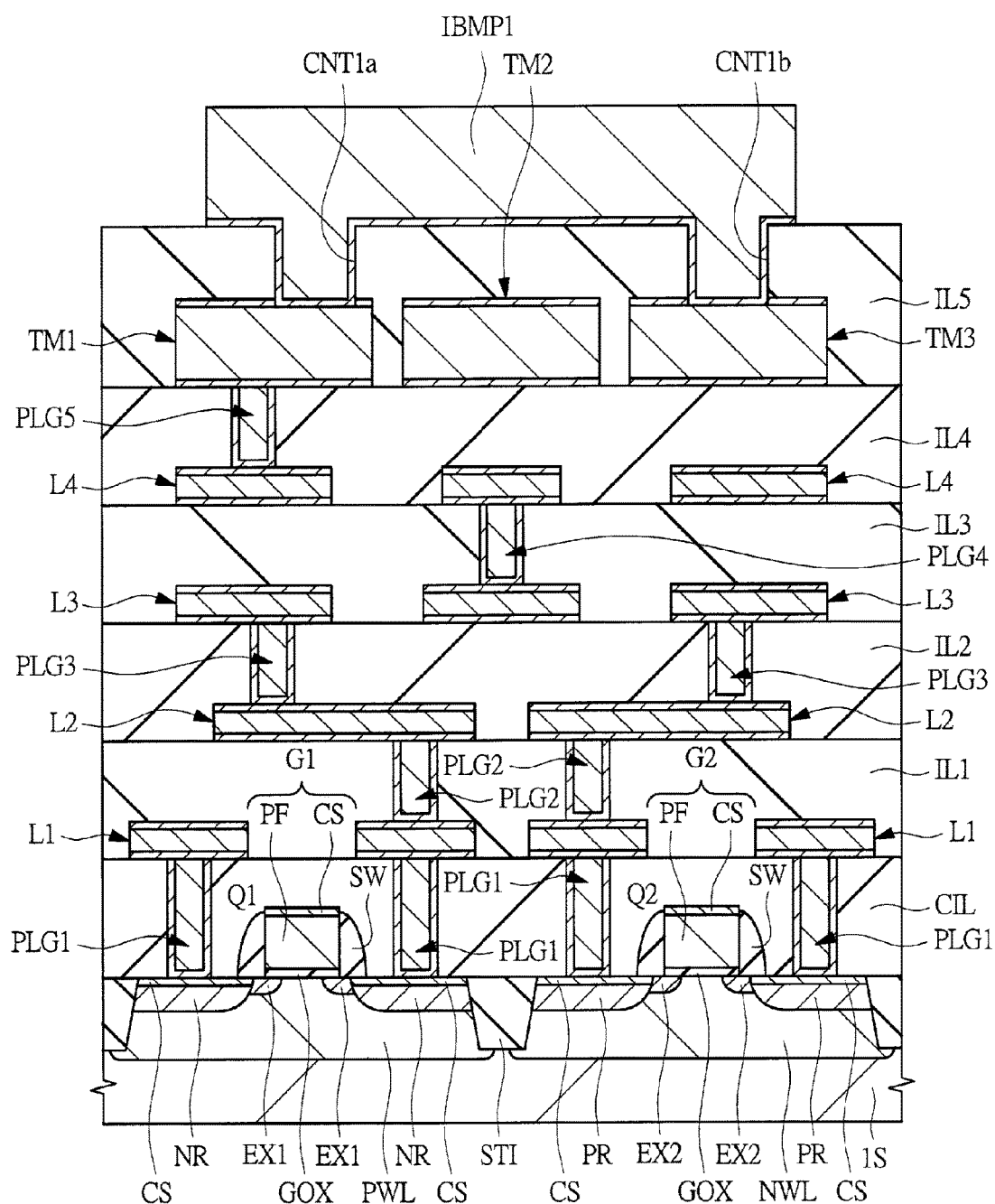
FIG. 16 is a section view cut along A-A line in FIG. 15.

FIG. 16 is a section view cut by A-A line in FIG. 15, a section view showing a configuration of the semiconductor device in the present fifth embodiment. The device structure shown in FIG. 16 is substantially the same as that shown in FIG. 14, and therefore, a different structure will be described. The device structure shown in FIG. 16 differs from that shown in FIG. 14 in the coupling relationship between the input bump electrode IBMP1 and the uppermost layer wirings TM1, TM2, TM3. The input bump electrode IBMP1 shown in FIG. 16 is coupled to the two openings, CNT1a and CNT1b. Then, via the opening CNT1a, the input bump electrode IBMP1 and the uppermost layer wiring TM1 are electrically coupled and via the opening CNT1b, the input bump electrode IBMP1 and the uppermost layer wiring TM3 are electrically coupled. The other parts of the device structure are the same as those of the device structure shown in FIG. 14. In the manner described above, the device structure is formed, in which the two openings CNT1a, CNT1b are coupled to one input bump electrode IBMP.

Sixth Embodiment

In a sixth embodiment, a step of mounting the semiconductor chip CHP2 constituting an LCD driver over a mounting substrate (glass substrate) will be described. First, by using the normal semiconductor manufacturing technique, a semiconductor element, such as MISFET, is formed over the semiconductor substrate and then, a multilayer wiring is formed over the semiconductor substrate over which the semiconductor element is formed. Then, after forming an uppermost layer wiring formed in the uppermost layer of the multilayer wiring, a surface protection film that covers the uppermost layer wiring is formed. Then, an opening that reaches the uppermost layer wiring is formed in the surface protection film and the opening is filled and at the same time, a bump electrode (input bump electrode and output bump electrode) is formed over the surface protection film. Then, by dicing the semiconductor substrate, it is possible to obtain the individual semiconductor chips CHP2 as shown in FIG. 4.

Figure 17:
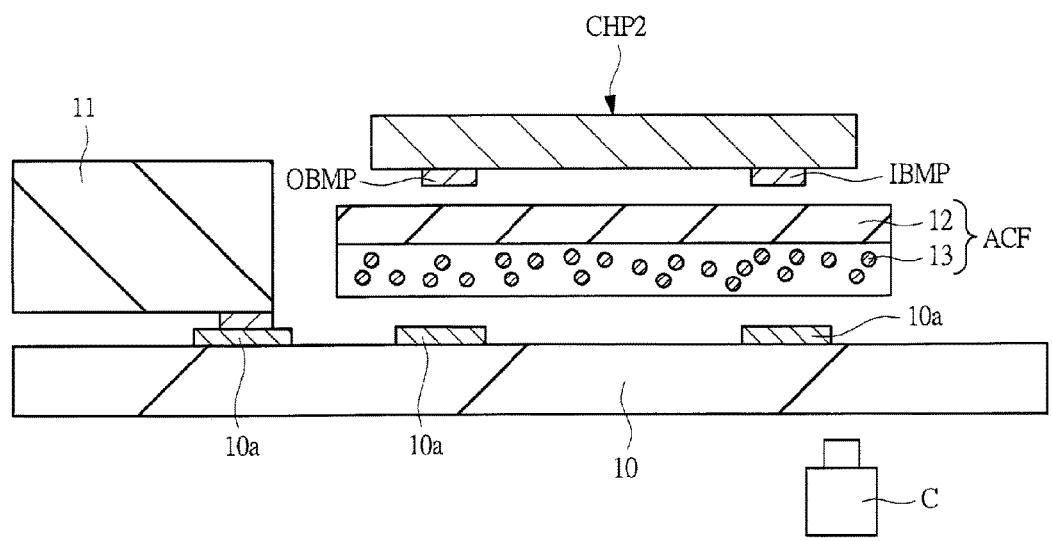
FIG. 17 is a section vies showing a manufacturing process of a semiconductor device in a sixth embodiment.

Next, a step of mounting the semiconductor chip CHP2 formed as described above over a mounting substrate (glass substrate) by adhesion will be described. FIG. 17 shows a case where the semiconductor chip CHP2 is mounted over a glass substrate 10 (COG: Chip On Glass). As shown in FIG. 17, over the glass substrate 10, a glass substrate 11 is mounted and thus a display part of an LCD is formed. Then, over the glass substrate 10 in the vicinity of the display part of the LCD, a region is formed where the semiconductor chip CHP2, which is an LCD driver, is mounted. In the semiconductor chip CHP2, the input bump electrode IBMP and the output bump electrode OBMP are formed and the input bump electrode IBMP and the output bump electrode OBMP are coupled to electrodes 10a (ITO electrode) formed over the glass substrate 10 via an anisotropic conductive film ACF. The anisotropic conductive film ACF is configured so as to have an insulating layer 12 and metal particles 13.

In this step, the semiconductor chip CHP2 and the electrodes 10a formed over the glass substrate 10 are aligned using a camera C. By this alignment, the accurate position of the semiconductor chip CHP2 is grasped by the camera C recognizing an alignment mark formed in the semiconductor chip CHP2.

Figure 18:
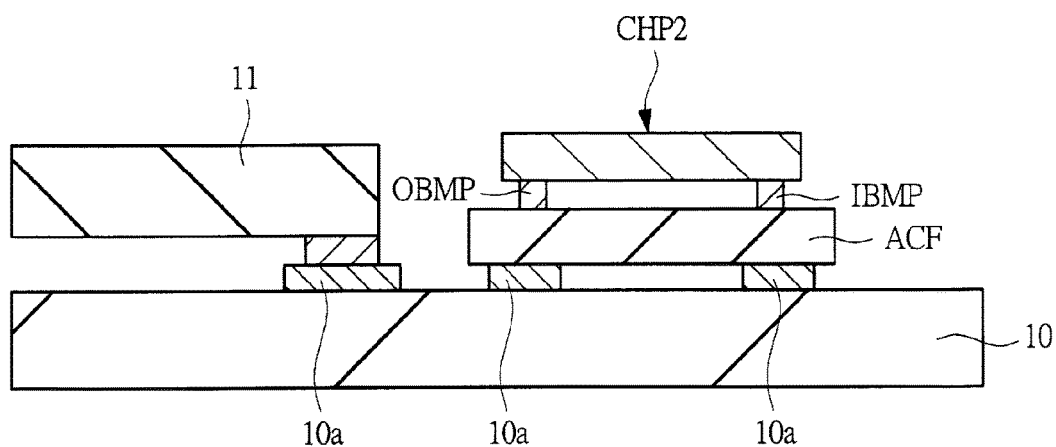
FIG. 18 is a section view showing the manufacturing process of a semiconductor device, following FIG. 17.

FIG. 18 is a section view showing the state where the semiconductor chip CHP2 is mounted over the anisotropic conductive film ACF after the alignment by the camera C is performed. At this time, the accurate alignment is performed between the semiconductor chip CHP2 and the glass substrate 10, and therefore, over the electrode 10a, the input bump electrode IBMP and the output bump electrode OBMP are located.

Figure 19:
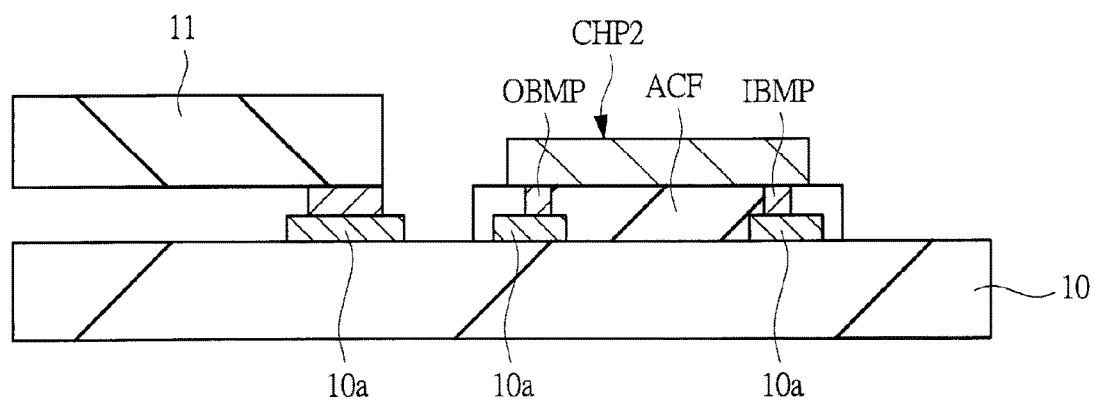
FIG. 19 is a section view showing the manufacturing process of a semiconductor device, following FIG. 18.

Subsequently, as shown in FIG. 19, the input bump electrode IBMP and the output bump electrode OBMP are coupled to the electrode 10a via the anisotropic conductive film ACF. The anisotropic conductive film ACF is a film obtained by molding a mixture of thermosetting resin and fine metal particles having conductivity into the form of a film. The metal particle is a sphere in which a nickel layer and a gold-plated layer are formed mainly from the inside and an insulating layer is overlapped on the outermost side, having a diameter of 3 to 5 µm. In this state, when the semiconductor chip CHP2 is mounted over the glass substrate 10, the anisotropic conductive film ACF is sandwiched between the electrode 10a of the glass substrate 10, and the input bump electrode IBMP and the output bump electrode OBMP of the semiconductor chip CHP2. Then, if the semiconductor chip CHP2 is pressurized while heating with a heater etc., a pressure is applied only to the portion corresponding to the input bump electrode IBMP and the output bump electrode OBMP. Because of this, the metal particles dispersed within the anisotropic conductive film ACF come into contact with and overlap one another, and are pressed against one another. As a result, an electrically conductive path is formed in the anisotropic conductive film ACF via the metal particles. Metal particles in a portion of the anisotropic conductive film ACF to which no pressure is applied still hold the insulating layer formed on the surface of the metal particle, and therefore, the insulation between input bump electrodes IBMP located side by side and between the output bump electrodes OBMP located side by side is held. Because of this, there is an advantage that the semiconductor chip CHP2 can be mounted over the glass substrate 10 without causing short circuit even if the separation between the input bump electrodes IBMP or the separation between the output bump electrodes OBMP is narrow.

Figure 20:
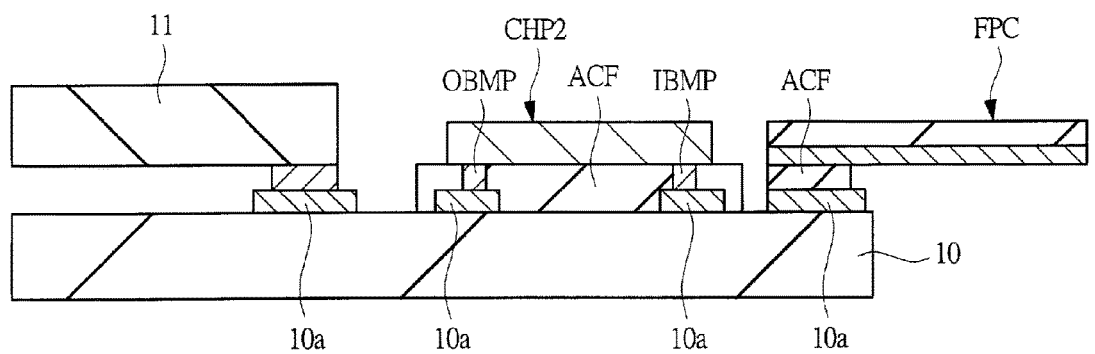
FIG. 20 is a section view showing the manufacturing process of a semiconductor device, following FIG. 19.

Subsequently, as shown in FIG. 20, the glass substrate 10 and a flexible printed circuit FPC is also coupled via the anisotropic conductive film ACF. As described above, in the semiconductor chip CHP2 mounted over the glass substrate 10, the output bump electrode OBMP is electrically coupled to the display part of the LCD and the input bump electrode IBMP is coupled to the flexible printed circuit FPC.

Figure 21:
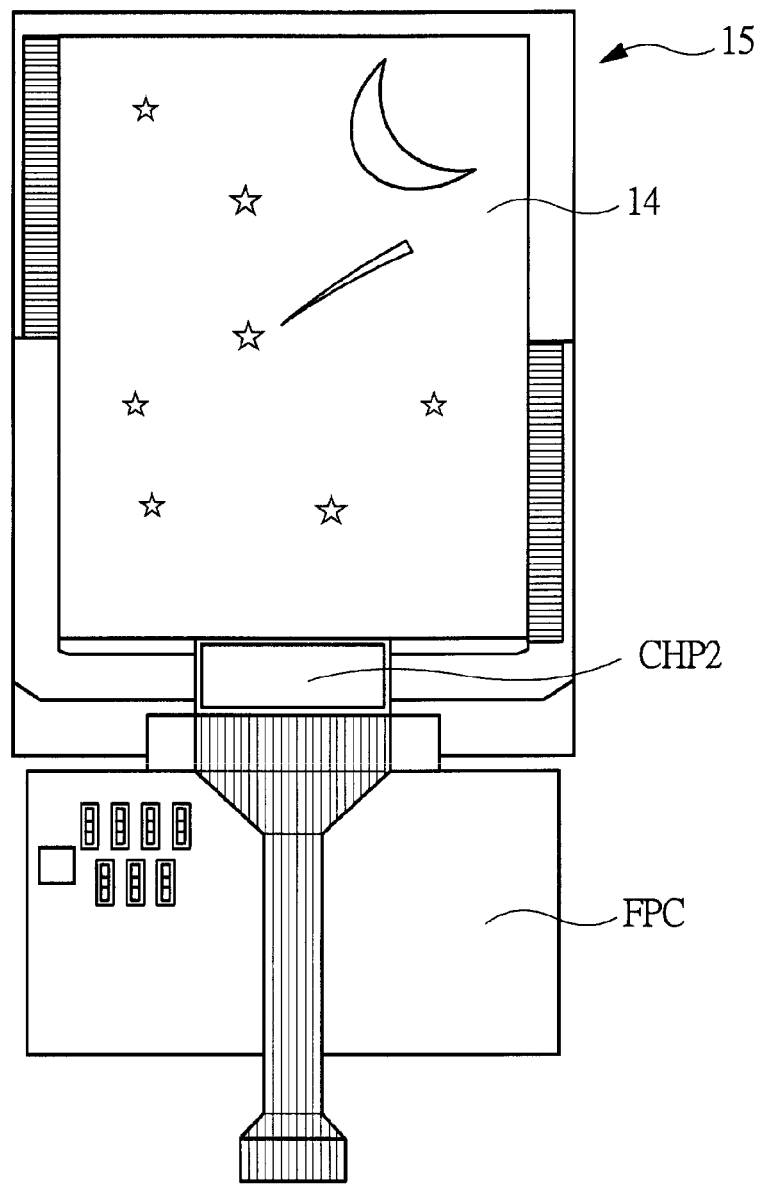
FIG. 21 is a diagram showing an overall configuration of an LCD (Liquid Crystal Device)

FIG. 21 is a diagram showing an overall configuration of an LCD (liquid crystal display device) 15. As shown in FIG. 21, a display part 14 of the LCD is formed over a glass substrate and an image is displayed on the display part 14. Over the glass substrate in the vicinity of the display part 14, the semiconductor chip CHP2, which is an LCD driver, is mounted. In the vicinity of the semiconductor chip CHP2, the flexible printed circuit FPC is mounted and between the flexible printed circuit FPC and the display part 14 of the LCD, the semiconductor chip CHP2, which is a driver, is mounted. In this manner, it is possible to mount the semiconductor chip CHP2 over the glass substrate. As described above, it is possible to mount the semiconductor chip CHP2, which is an LCD driver, in the liquid crystal display 15.

Seventh Embodiment

Figure 22:
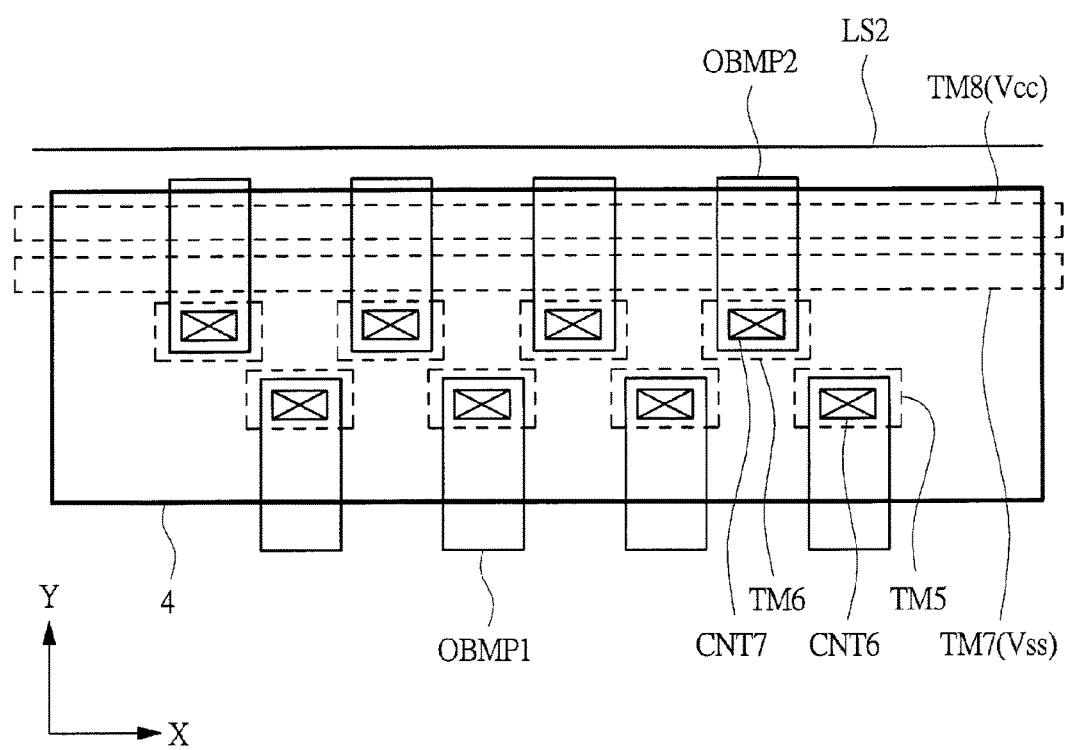
FIG. 22 is an enlarged view of a region in the vicinity of a long side on the side of an output bump electrode of a semiconductor chip, which is an LCD driver, in a seventh embodiment.

In a seventh embodiment, a plane layout of output bump electrodes, uppermost layer wirings, and an output protection circuit will be described. FIG. 22 is an enlarged view of a region in the vicinity of the long side LS2 of the semiconductor chip CHP2 constituting the LCD driver shown in FIG. 4.

As shown in FIG. 22, output bump electrodes OBMP1 close to the internal circuit of the semiconductor chip CHP2 and output bump electrodes OBMP2 close to the side of the long side LS2 are arranged in a staggered manner. A plurality of the output bump electrodes OBMP1 and a plurality of the output bump electrodes OBMP2 are arranged in the direction (X direction) along the long side LS2, respectively. Over a semiconductor substrate under the output bump electrode OBMP1 and the output bump electrode OBMP2, the output protection circuit 4 is arranged. In the region of the output protection circuit 4, a plurality of semiconductor elements for circuit protection as shown in FIG. 2 or FIG. 3 is formed and electrically coupled to the output bump electrode OBMP1 and the output bump electrode OBMP2, respectively. The output protection circuit 4 is electrically coupled to the output bump electrode OBMP1 and the output bump electrode OBMP2 via an uppermost layer wiring TM5 or an uppermost layer wiring TM6. Further, the uppermost layer wiring TM5 and the uppermost layer wiring TM6 are coupled to the output bump electrode OBMP1 and the output bump electrode OBMP2, respectively, via an opening CNT6 or an opening CNT7, respectively.

Here, the opening CNT7 of the output bump electrode OBMP2 is provided at a position close to the internal circuit rather than to the side of the long side LS2. Due to this, an uppermost layer wiring TM7 (power supply wiring) (reference potential Vss) and an uppermost layer wiring TM8 (power supply wiring) (external power supply potential Vcc) can be routed around the outer circumference of the semiconductor chip CHP2. That is, it is possible to effectively use the region at the top part of the output protection circuit 4 and at the lower part of the output bump electrode OBMP2. As described above, in the semiconductor chip CHP2 in the present seventh embodiment, the output bump electrode OBMP1 and the output bump electrode OBMP2 are also devised to reduce the chip size.

That is, the characteristic in the present seventh embodiment is that the output bump electrodes OBMP2 arranged at the position close to the long side LS2 and the output bump electrodes OBMP1 arranged at the position farther from the long side LS2 than the output bump electrodes OBMP2 are provided as the output bump electrodes arranged in a staggered manner. Then, under the output bump electrode OBMP1, the uppermost layer wiring TM5 is formed and under the output bump electrode OBMP2, the uppermost layer wiring TM6 is formed. At this time, the output bump electrode OBMP1 is coupled to the uppermost layer wiring TM5 via the opening CNT6 formed in the insulating film and the output bump electrode OBMP2 is coupled to the uppermost layer wiring TM6 via the opening CNT7 formed in the insulating film. It is characteristic that the position at which the opening CNT6 is formed is a position closer to the long side LS2 than the center of the output bump electrode OBMP1 and the position at which the opening CNT7 is formed is a position farther from the long side LS2 than the center of the output bump electrode OBMP2.

Unlike the input bump electrodes IBMP shown in the third embodiment described above, all of the positions of the openings CNT7 of the output bump electrodes OBMP2 are the same and all of the positions of the openings CNT6 of the output bump electrodes OBMP1 are the same. That is, the input bump electrodes IBMP are formed linearly and the positions of some openings (for example, the openings CNT1 to CNT3 in FIG. 8 and FIG. 9) are different. However, the output bump electrodes OBMP1 are formed linearly and the positions of the openings CNT6 are the same. The output bump electrode OBMP2 are formed in the form of a straight line different from that of the output bump electrodes OBMP1 and the positions of the openings CNT7 are the same.

With the technique disclosed in the present seventh embodiment as described above, it is possible to reduce the size in the short-side direction of the semiconductor chip CHP2.

The technique disclosed in the present seventh embodiment can also be applied to the other embodiments described above.

Eighth Embodiment

Figure 23:
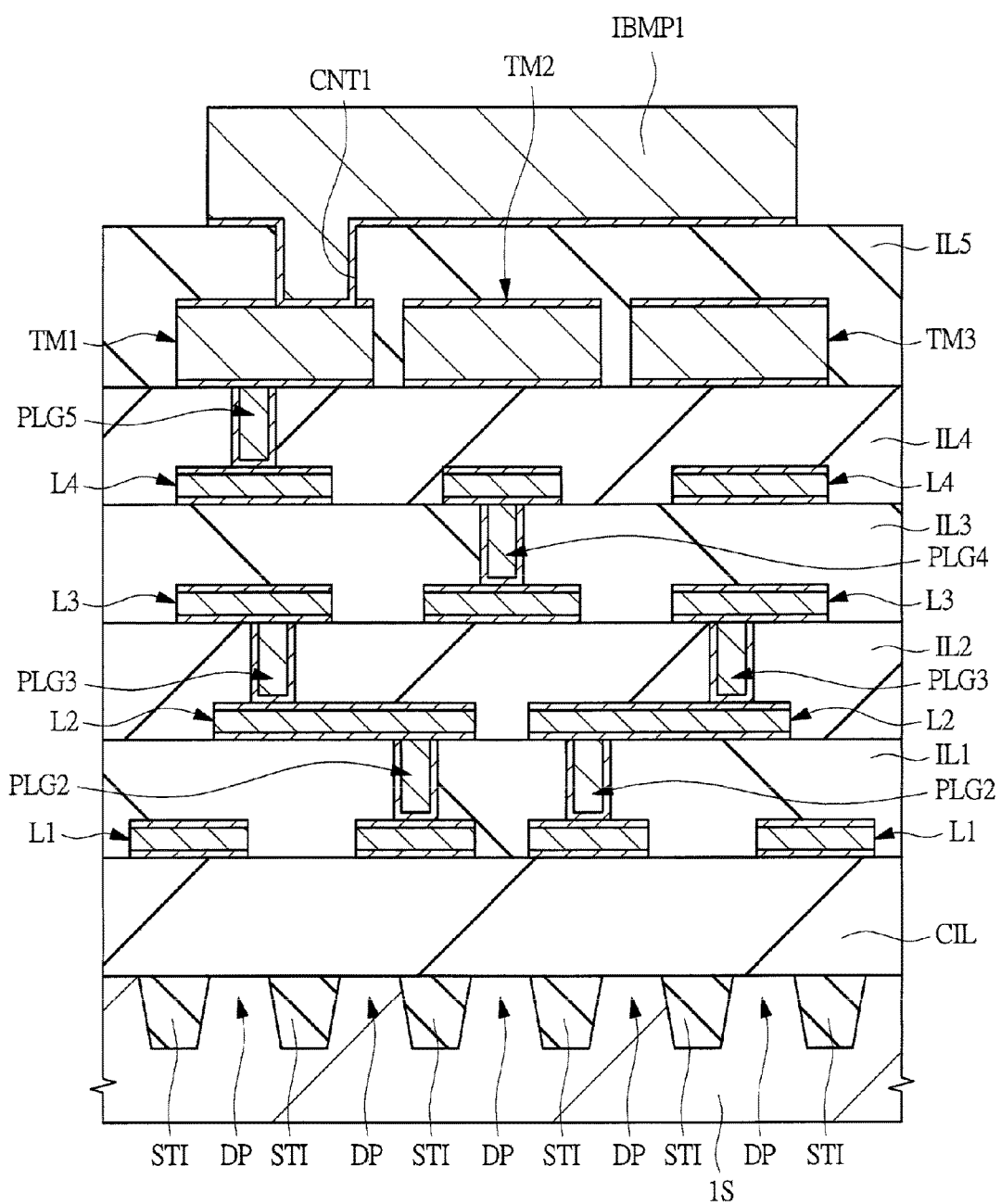
FIG. 23 is a section view in an eighth embodiment, a section view cut along A-A line in FIG. 13.

In an eighth embodiment, a case is illustrated, where a dummy region where no semiconductor element is formed is arranged in a region that overlaps the input bump electrodes IBMP1, IBMP2 in a planar view. FIG. 23 is a section view cut along A-A line in FIG. 13, a section view illustrating the present eighth embodiment.

For example, in the fifth embodiment described above, the example is shown, where the internal circuit IU is arranged in the region that overlaps the input bump electrodes IBMP1, IBMP2 in a planar view, however, this is not limited, the region that overlaps the input bump electrodes IBMP1, IBMP2 in a planar view may be a dummy region where no semiconductor element is formed. The dummy region is a region of a semiconductor substrate defined by the element isolation region STI, which does not contribute to the circuit operation of the semiconductor device.

In FIG. 23, as an example of a dummy region, a dummy pattern DP provided to prevent dishing is shown. In the dummy pattern DP, a plurality of patterns is provided in the same form and formed at the same pitch, and arranged regularly.

As described above, in the present eighth embodiment also, as in the fifth embodiment described above, it is possible to cause a plurality of wiring layers to pass through the lower layer of the input bump electrodes IBMP1, IBMP2, and therefore, it is possible to increase the degree of freedom in wiring layout.

Further, the dummy pattern DP is provided in a region that overlaps the input bump electrodes IBMP1, IBMP2 in a planar view, and therefore, the flatness of each wiring layer can be improved.

The technique disclosed in the present eighth embodiment can also be applied to the other embodiments described above.

The invention made by the inventors of the present invention is described based on the embodiments as described above, however, the present invention is not limited to the embodiments and it is obvious that there can also be various modifications within the scope not departing from its gist.

In the present embodiments, the drive device (LDC driver) for liquid crystal display is illustrated, however, this is not limited and the present invention can also be applied to other drive devices for display, such as an organic EL. Further, the present invention is not limited to a drive device but can be applied to other semiconductor devices. In particular, it is preferable to apply the present invention to a case where a semiconductor chip is in the form of a rectangle.

The present invention can be used widely in the manufacturing industry that manufactures semiconductor devices.

What is claimed is:

1. A semiconductor device comprising:
   (a) a semiconductor substrate of substantially rectangular shape having a pair of long edges and a pair of short edges;
   (b) an internal circuit including a plurality of MISFETs formed over the semiconductor substrate;
   (c) a plurality of protection elements formed over the semiconductor substrate so as to protect the internal circuit against static electricity;
   (d) a first insulating film formed over the semiconductor substrate so as to cover the plurality of MISFETs and the plurality of protection elements; and
   (e) a plurality of bump electrodes formed over the first insulating film, the plurality of bump electrodes being arranged along a first long edge of the pair of long edges,
   wherein the plurality of bump electrodes are bump electrodes for receiving input signals from an external device,
   wherein the plurality of protection elements are electrically coupled between the respective plurality of bump electrodes and the internal circuit,
   wherein the plurality of bump electrodes include a first bump electrode and a second bump electrode,
   wherein the plurality of protection elements include a first protection element and a second protection element,
   wherein the first protection element electrically coupled to the first bump electrode is disposed at a position overlapped with the first bump electrode in a planar view when viewed from a direction perpendicular to the substrate, and wherein the second protection element electrically coupled to the second bump electrode is disposed at a position different from a position overlapped with the second bump electrode in a planar view when viewed from a direction perpendicular to the substrate.

2. The semiconductor device according to claim 1,
wherein the third bump electrode is disposed so as to overlap parts of the plurality of MISFETs in a planar view when viewed from a direction perpendicular to the substrate.

3. The semiconductor device according to claim 1,
wherein the second protection element is disposed at an inner side of the semiconductor substrate than the plurality of bump electrodes in a first direction along the pair of short edges of the semiconductor substrate in a planar view.

4. The semiconductor device according to claim 1, further comprising:
(f) another plurality of protection elements formed over the semiconductor substrate so as to protect the internal circuit against static electricity;
(g) another plurality of bump electrodes formed over the first insulating film, the other plurality of bump electrodes being arranged along a second long edge of the pair of long edges,
wherein the other plurality of bump electrodes are bump electrodes for sending output signals to another external device, and
wherein the other plurality of protection elements are electrically coupled between the other respective plurality of bump electrodes and the internal circuit.

5. The semiconductor device according to claim 4,
wherein the other plurality of protection elements are disposed at a position overlapped with the other plurality of bump electrodes in a planar view when viewed from a direction perpendicular to the substrate.

6. The semiconductor device according to claim 1,
wherein the plurality of bump electrodes are arranged linearly while the other plurality of bump electrodes are arranged in a staggered manner.

7. The semiconductor device according to claim 1,
wherein the respective plurality of protection elements includes two diodes.

8. The semiconductor device according to claim 1,
wherein the respective plurality of protection elements includes two transistors.

9. The semiconductor device according to claim 1,
wherein the semiconductor device is an LCD driver configured to drive a liquid crystal display device.

* * * * *